United States Patent
Han et al.

(10) Patent No.: US 9,666,134 B2
(45) Date of Patent: May 30, 2017

(54) BIDIRECTIONAL SCAN DRIVING STAGE FOR IMPROVING DC BIAS STRESS STABILITY OF CIRCUIT ELEMENTS AND INCLUDING MULTIPLE LOW POTENTIAL POWER SOURCE VOLTAGES

(71) Applicant: Samsung Display Co., Ltd., Yongin (KR)

(72) Inventors: Woo-Seok Han, Yongin (KR); Jin-Wook Yang, Yongin (KR); Yun-Ho Kim, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 288 days.

(21) Appl. No.: 14/185,607

(22) Filed: Feb. 20, 2014

(65) Prior Publication Data

US 2015/0015562 A1    Jan. 15, 2015

(30) Foreign Application Priority Data

Jul. 9, 2013    (KR) ........................ 10-2013-0080546

(51) Int. Cl.
*G11C 19/28* (2006.01)
*G09G 3/32* (2016.01)
*G09G 3/3266* (2016.01)

(52) U.S. Cl.
CPC ........... *G09G 3/3266* (2013.01); *G11C 19/28* (2013.01); *G09G 2310/0286* (2013.01)

(58) Field of Classification Search
CPC .. G09G 3/3266; G09G 3/3674–3/3677; G09G 2310/0267; G09G 2310/0286
See application file for complete search history.

(56) References Cited

U.S. PATENT DOCUMENTS

| | | | | |
|---|---|---|---|---|
| 8,860,651 B2* | 10/2014 | Tseng | ...................... | G11C 19/28 345/100 |
| 2010/0141641 A1* | 6/2010 | Furuta | .................. | G11C 19/184 345/213 |

(Continued)

FOREIGN PATENT DOCUMENTS

| | | |
|---|---|---|
| EP | 2562761 | 2/2013 |
| KR | 10-2006-0076147 | 7/2006 |

(Continued)

*Primary Examiner* — Chanh Nguyen
*Assistant Examiner* — Navin Lingaraju
(74) *Attorney, Agent, or Firm* — Cantor Colburn LLP

(57) ABSTRACT

A scan driving device includes shift registers, each including a first signal terminal to which a forward direction driving start signal is transferred, a second signal terminal to which a backward direction driving start signal is transferred, a clock signal terminal and a clock bar signal terminal to which a clock signal and a clock bar signal are applied, a sustain signal terminal to which a sustain signal is transferred, a control signal terminal to which a control signal is transferred, a gate clock signal terminal to which a gate clock signal is transferred, and an output signal terminal, where driving power source voltages including a high potential power source voltage and low potential power source voltages is applied to each shift register, and an application of the low potential power source voltages to each shift register is controlled based on the sustain signal.

29 Claims, 9 Drawing Sheets

(56) References Cited

U.S. PATENT DOCUMENTS

| | | | | |
|---|---|---|---|---|
| 2010/0177082 A1* | 7/2010 | Joo | ................... | G09G 3/3677 345/211 |
| 2010/0277206 A1* | 11/2010 | Lee | ................... | G09G 3/3677 327/108 |
| 2011/0273417 A1* | 11/2011 | Shin | ...................... | G09G 3/20 345/211 |
| 2012/0032615 A1* | 2/2012 | Kikuchi | ............... | G11C 19/28 315/320 |
| 2012/0092311 A1* | 4/2012 | Ohkawa | ............. | G09G 3/3655 345/204 |
| 2012/0092323 A1* | 4/2012 | Murakami | .......... | G09G 3/3677 345/211 |
| 2012/0139962 A1* | 6/2012 | Chung | ............... | G09G 3/3266 345/690 |
| 2012/0286855 A1* | 11/2012 | Umezaki | ................ | G09G 3/20 327/538 |
| 2013/0127809 A1* | 5/2013 | Han | ...................... | G09G 3/20 345/211 |
| 2013/0135284 A1* | 5/2013 | Tseng | ................... | G11C 19/28 345/212 |
| 2013/0147524 A1* | 6/2013 | Hachida | .............. | G09G 3/3677 327/108 |
| 2013/0169319 A1* | 7/2013 | Sasaki | ................ | G11C 19/184 327/108 |

FOREIGN PATENT DOCUMENTS

| | | |
|---|---|---|
| KR | 10-2011-0000470 | 1/2011 |
| KR | 10-2012-0011966 | 2/2012 |
| KR | 10-2012-0028333 | 3/2012 |

\* cited by examiner

BIDIRECTIONAL SCAN DRIVING STAGE FOR IMPROVING DC BIAS STRESS STABILITY OF CIRCUIT ELEMENTS AND INCLUDING MULTIPLE LOW POTENTIAL POWER SOURCE VOLTAGES

This application claims priority to Korean Patent Application No. 10-2013-0080546, filed on Jul. 9, 2013, and all the benefits accruing therefrom under 35 U.S.C.§119, the content of which in its entirety is herein incorporated by reference.

BACKGROUND (a) Field

Exemplary embodiments of the invention relate to a scan driving device and a display device including the scan driving device.

(b) Description of the Related Art

An organic light emitting diode display, which is a type of flat panel display, typically displays an image using an organic light emitting diode ("OLED") that generates light by recombination of electrons and holes. The organic light emitting diode display typically has a high response speed, is driven with low power consumption, and has high luminous efficiency, luminance and viewing angle which receives.

The organic light emitting diode display may be classified into a passive matrix type organic light emitting diode ("PMOLED") display and an active matrix type organic light emitting diode ("AMOLED") display according to a method of driving the organic light emitting diode.

The PMOLED display typically includes an anode and a cathode arranged orthogonal to each other and driven by selecting a cathode line and an anode line. The AMOLED display typically includes a thin film transistor and a capacitor integrated in each pixel to maintain a voltage by capacitance.

The AMOLED display generally includes a display device including pixels arranged in a matrix form, a data driving device for transferring a data signal to data lines connected to the pixels, and a scan driving device for transferring a scan signal to scan lines connected to the pixels.

In a driving method of the scan driving device of the AMOLD display, the pixels are selected in a line unit using a plurality of shift registers included in the scan driving device, and the scan signals are sequentially supplied every horizontal period.

Generally, circuit elements constituting the scan driving device are a thin film transistor that functions as a switch. The thin film transistor is operated in a saturation mode by transferring a gate-on-voltage to the thin film transistor. In the scan driving device, a gate electrode voltage applied to the thin film transistor may not be lower than a voltage applied to the scan driving device from the outside, and an output terminal node of the scan driving device may be unstable, such that an operation of a thin film transistor connected to the output terminal node may be substantially unstable.

SUMMARY

Exemplary embodiments of the invention relate to a scan driving device in which direct current ("DC") bias stress stability in each element constituting a circuit is substantially improved to stably output a scan signal.

Exemplary embodiments of the invention relate to a display device including the scan driving device which stably outputs the scan signal.

According to an exemplary embodiment, a scan driving device includes a plurality of shift registers which generates a plurality of scan signals and transfers the scan signals to a plurality of scan lines of a display device, where the shift registers define a plurality of stages, respectively, and a shift register of each stage includes: a first signal terminal to which a forward direction driving start signal or an output signal of the shift register of a prior stage is transferred; a second signal terminal to which a backward direction driving start signal or the output signal of the shift register of a next stage is transferred; a clock signal terminal to which one of a clock signal and a clock bar signal is applied, where the clock signal terminal of the shift register of one of two adjacent stages receive the clock signal, and the clock signal terminal of the shift register of the other of the two adjacent stages receives the clock bar signal; a clock bar signal terminal to which the other of the clock bar signal and the clock signal is applied, where the clock bar signal terminal of the shift register of the one of the two adjacent stages receive the clock bar signal, and the clock bar signal terminal of the shift register of the other of the two adjacent stages receives the clock signal; a sustain signal terminal to which a sustain signal is transferred; a control signal terminal to which a control signal is transferred; a gate clock signal terminal to which a gate clock signal is transferred; and an output signal terminal connected to a corresponding scan line of the scan lines, the first signal terminal of the shift register of the next stage and the second signal terminal of the shift register of the prior stage, where the output signal terminal outputs a scan signal of the corresponding scan line as the output signal thereof, where a plurality of driving power source voltages including a high potential power source voltage and a plurality of low potential power source voltages is applied to the shift register of each stage, and an application of the low potential power source voltages to the shift register of each stage is controlled based on the sustain signal applied to the sustain signal terminal thereof.

In an exemplary embodiment, the shift register of each stage may further include: a sustain control signal terminal to which a sustain control signal, which controls a first switch or a second switch, is transferred, where the first switch controls a forward direction driving thereof, and the second switch controls a backward direction driving thereof, where the sustain signal applied to the sustain signal terminal controls a switch for controlling a transfer of the low potential power source voltages to a node therein.

In an exemplary embodiment, the sustain signal may be transferred at a first level voltage for turning-on a switch of the shift registers before a driving of a plurality of shift registers is initiated.

In an exemplary embodiment, the driving of a plurality of shift registers may include a simultaneous driving, in which a plurality of output signals of the shift registers are simultaneously outputted, and a sequential driving, in which the output signals of the shift registers are sequentially outputted in a forward direction or a backward direction.

In an exemplary embodiment, the shift registers may simultaneously generate output signals during a first period where the control signal is transferred at the first level voltage for turning-on the switch of the shift registers.

In an exemplary embodiment, the output signals simultaneously generated in the shift registers during the first period may be generated based on the gate clock signal transferred during the first period.

In an exemplary embodiment, after the first period elapses, the clock signal and the clock bar signal transferred to the shift register of each stage may be transferred at the first level voltage to output the output signals of the shift registers at one of the low potential power source voltages.

In an exemplary embodiment, an input signal applied to the first signal terminal of the shift register of each stage may be transferred at the first level voltage for turning-on the switch of the shift registers, and the shift registers may sequentially generate a plurality of output signals in the forward direction.

In an exemplary embodiment, the input signal applied to the second signal terminal of each of a plurality of shift registers may be transferred at the first level voltage turning-on the switch of the shift registers, and the shift registers may sequentially generate a plurality of output signals in the backward direction.

In an exemplary embodiment, the output signals sequentially generated in a plurality of shift registers may be generated based on one of the clock signal and the clock bar signal transferred to the clock signal terminal of the shift register of each stage.

In an exemplary embodiment, the low potential power source voltages may include a first low potential power source voltage, a second low potential power source voltage, and a third low potential power source voltage, where a voltage level of the second low potential power source voltage may be lower than a voltage level of the first low potential power source voltage, and higher than a voltage level of the third low potential power source voltage.

In an exemplary embodiment, the shift register of each stage may further include: a first transistor which transfers one power source voltage of the low potential power source voltages in response to the sustain signal; a second transistor including a gate electrode connected to the first transistor, where the second transistor transfers the high potential power source voltage to a first node in response to the forward direction driving start signal or the output signal of the shift register of the prior stage; and a third transistor which generates the output signal based on a pulse voltage of the clock signal or the clock bar signal transferred to the clock signal terminal in response to a voltage of the first node.

In an exemplary embodiment, the shift register of each stage may further include: a fourth transistor which transfers one power source voltage of the low potential power source voltages in response to the sustain signal; and a fifth transistor including the gate electrode connected to one electrode of the fourth transistor and which transfers one power source voltage of the low potential power source voltages to the first node in response to the backward direction driving start signal or the output signal of the shift register of the next stage.

In an exemplary embodiment, the shift register of each stage may further include: a sixth transistor which transfers one power source voltage of the low potential power source voltages in response to the sustain signal; a seventh transistor including a gate electrode connected to the sixth transistor, where the seventh transistor transfers one power source voltage of the low potential power source voltages to a second node in response to the voltage of the first node; an eighth transistor including a gate electrode connected to the second node, where the eight transistor transfers one power source voltage of the low potential power source voltages to the first node in response to a voltage of the second node; and a first capacitor connected between the first node and the gate electrode of the seventh transistor.

In an exemplary embodiment, the second node may be connected to the clock signal terminal through a second capacitor, and the pulse voltage of the clock signal or the clock bar signal transferred to the clock signal terminal may be transferred to the second node.

In an exemplary embodiment, the eighth transistor may include at least two sub-transistors connected in series, and gate electrodes of the at least two sub-transistors may be commonly connected to the second node.

In an exemplary embodiment, the shift register of each stage may further include: a ninth transistor which transfers one power source voltage of the low potential power source voltages in response to the voltage of the second node to a third node to which the output signal terminal is connected; and a tenth transistor which transfers one power source voltage of the low potential power source voltages to the third node in response to the clock signal or the clock bar signal inputted to the clock bar signal terminal.

In an exemplary embodiment, the shift register of each stage may further include: an eleventh transistor which transfers one power source voltage of the low potential power source voltages in response to the sustain signal; a twelfth transistor including a gate electrode which receives the power source voltage transferred by the eleventh transistor, where the twelfth transistor transfers the pulse voltage of the control signal to a fourth node in response to the power source voltage; a thirteenth transistor including a gate electrode connected to the fourth node, where the thirteenth transistor transfers the pulse voltage of the gate clock signal to the third node in response to a voltage of the fourth node; a second capacitor connected between the gate electrode of the twelfth transistor and the control signal terminal; and a third capacitor connected between the third node and the fourth node.

In an exemplary embodiment, the shift register of each stage may further include: a fourteenth transistor which transfers one power source voltage of the low potential power source voltages to the third node in response to the sustain signal; a fifteenth transistor which transfers one of the low potential power source voltages, which is different from the one power source voltage transferred by fourteenth transistor, to the fourth node in response to the sustain signal; a sixteenth transistor which transfers one power source voltage of the low potential power source voltages to the fourth node in response to the clock signal or the clock bar signal transferred to the clock signal terminal; and a seventeenth transistor which transfers one power source voltage of the low potential power source voltages to the gate electrode of the sixteenth transistor in response to the sustain signal.

In an exemplary embodiment, the shift register of each stage may further include: an eighteenth transistor which transfers one power source voltage of the low potential power source voltages in response to the sustain signal; a nineteenth transistor including a gate electrode connected to the eighteenth transistor, where the ninth transistor transfers one power source voltage of the low potential power source voltages to the first node in response to the control signal transferred to the gate electrode thereof; and a twentieth transistor which transfers one power source voltage of the low potential power source voltages to the first node in response to the sustain signal.

In an exemplary embodiment, the shift register of each stage may further include: a twenty-first transistor which transferrsany one source voltage of the low potential power source voltages in response to the sustain signal; a twenty-second transistor including a gate electrode connected to the twelfth transistor, where the twenty-second transistor transfers one power source voltage of the low potential power source voltages to the second node in response to the control signal transferred to the gate electrode thereof; and a twenty-third transistor which transfers one power source voltage of the low potential power source voltages to the second node in response to the sustain signal.

In an exemplary embodiment, the shift register of each stage may further include: a twenty-fourth transistor which transfers one power source voltage of the low potential power source voltages to a gate electrode of the tenth transistor in response to the sustain signal; a twenty-fifth transistor which transfers one power source voltage of the low potential power source voltages to the gate electrode of the tenth transistor in response to the control signal; and a twenty-sixth transistor which transfers one power source voltage of the low potential power source voltages to the gate electrode of the twenty-fifth transistor in response to the sustain signal.

In an exemplary embodiment, the shift register of each stage may further include: an eighteenth transistor which transfers one power source voltage of the low potential power source voltages to the first node in response to the sustain signal; and a nineteenth transistor which transferrsany one source voltage of the low potential power source voltages to the second node in response to the sustain signal.

In an exemplary embodiment, the shift register of each stage may further include: a twentieth transistor which transfers one power source voltage of the low potential power source voltages to a gate electrode of the tenth transistor in response to the sustain signal.

In another exemplary embodiment, a display device includes: a display unit including a plurality of scan lines through which a plurality of scan signals is transferred, a plurality of data lines through which a plurality of data signals is transferred, and a plurality of pixels connected to the scan lines and the data lines; a scan driver generates a corresponding scan signal of a plurality of scan signals and transfers the corresponding scan signal to each of a plurality of pixels. A data driver transfers the data signals to a plurality of data lines. A controller controls operations of the scan driver and the data driver.

In this case, the scan driver includes a plurality of shift registers including a first signal terminal to which a forward direction driving start signal or an output signal of the shift register of a prior stage is transferred, a second signal terminal to which a backward direction driving start signal or the output signal of the shift register of a next stage is transferred, a clock signal terminal to which a clock signal and a clock bar signal are alternately applied every stage, a clock bar signal terminal to which the clock bar signal and the clock signal are alternately applied every stage, a sustain signal terminal to which a sustain signal is transferred, a control signal terminal to which a control signal is transferred, and a gate clock signal terminal to which a gate clock signal is transferred. An output signal terminal is connected to a corresponding scan line of a plurality of scan lines, the first signal terminal of the shift register of the next stage, and the second signal terminal of the shift register of the prior stage, and outputs the scan signal as the output signal. A driving power source voltage of each of the plurality of shift registers may include a high potential power source voltage and a plurality of low potential power source voltages, and application of the plurality of low potential power source voltages may be controlled according to the sustain signal.

According to exemplary embodiments, as described herein, a scan driving device, in which DC bias stress stability is substantially improved in each element constituting a circuit, is substantially stably output a scan signal.

In such embodiments, a display device including the scan driving device is stably driven by a scan signal by improving bias stress stability of a gate terminal of an output terminal transistor of the scan driving device, such that an image having a high quality is displayed.

In such embodiments, the scan driving device may be substantially stably operated by changing DC driving into alternating current ("AC") driving by a gate holding transistor to remove stress of the transistor and prevent a fluctuation in threshold voltage.

In such embodiments, a dead space region in the display device may be be reduced when a circuit layout is designed with reduced number of constitution elements in a scan driving device.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
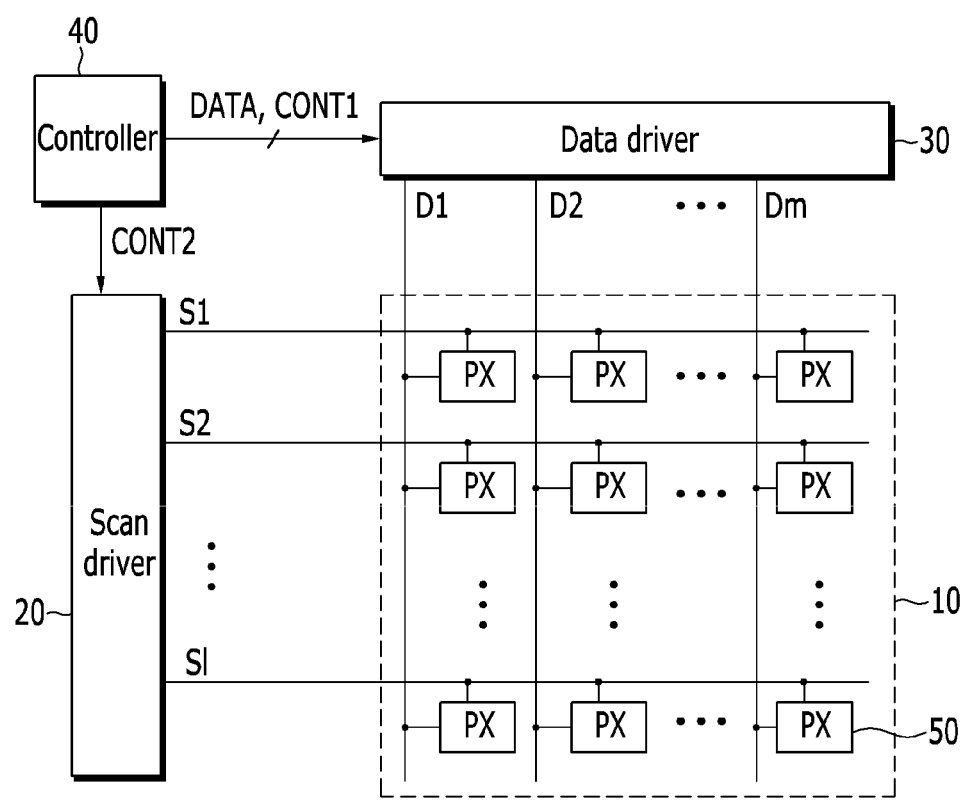
FIG. 1 is a block diagram showing an exemplary embodiment of a display device according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

FIG. 1 is a block diagram showing an exemplary embodiment of a display device according to the invention. An exemplary embodiment of the display device, as shown in FIG. 1, includes a display unit 10, scan and data drivers 20 and 30, which are connected to the display unit, and a controller 40 that controls the display unit 10, the scan driver 20 and the data driver 30.

In an exemplary embodiment, the display unit 10 includes a plurality of pixels PX, which is arranged substantially in a matrix form and connected to a plurality of display signal lines S1-Sl and D1-Dm.

The display signal lines S1-Sl and D1-Dm include a plurality of scan lines S1-Sl for transferring a scan signal (also referred to as "gate signal") and data lines D1-Dm for transferring a data signal. Here, l and m are natural numbers. The scan lines S1-Sl each extend substantially in a pixel row direction and are substantially parallel to each other. A plurality of data lines D1-Dm extend substantially in a pixel column direction and are substantially parallel to each other.

The scan driver 20 is connected to the scan lines S1-Sl and applies a plurality of scan signals for sequentially activating the pixels in to l-th pixel rows corresponding thereto. Each scan signal has a gate-on voltage and a gate-off voltage. The gate-on voltage is a voltage applied to a gate of a transistor in a pixel to turn on the transistor. The gate-off voltage is a voltage applied to the gate of the transistor to turn-off the transistor. The pixel that which receives the gate-on voltage of the scan signal is activated by the switching transistor turned-on by the gate-on voltage, and receives a voltage corresponding to a corresponding data signal.

The data driver 30, which is connected to the data lines D1-Dm, generates a data voltage based on a data signal DATA including a grayscale data of each pixel PX and transfer the data voltage to the data lines D1-Dm.

The controller 40 generates a scan driving control signal CONT2 for controlling an operation of the scan driver 20 and a data driving control signal CONT1 for controlling an operation of the data driver 30, and transfers the scan driving control signal CONT2 and the data driving control signal CONT1 to the scan driver 20 and the data driver 30, respectively.

In an exemplary embodiment, a pixel PX 50 is connected to a corresponding scan line of the scan lines S1-Sl and a corresponding data line of the data lines D1-Dm. The pixel PX receive the voltage of the data signal from the corresponding data line in response to the gate-on voltage of the scan signal transferred from the corresponding scan line. In an exemplary embodiment, the pixel 50 may include a pixel driver (not shown), which is driven to display an image based on the data signal applied thereto, and a light emitting unit (not shown) for emitting light corresponding to the grayscale data of the corresponding data signal.

In an exemplary embodiment, the pixel driver may include a switching transistor that which receives the data signal from the corresponding data line, a capacitor that stores the data signal, and a driving transistor that generates a driving current based on the data signal stored in the capacitor and transfers the driving current, but not being limited thereto.

In an exemplary embodiment, the light emitting unit is an organic light emitting diode that expresses the grayscale data using the driving current corresponding to the data signal.

Figure 2:
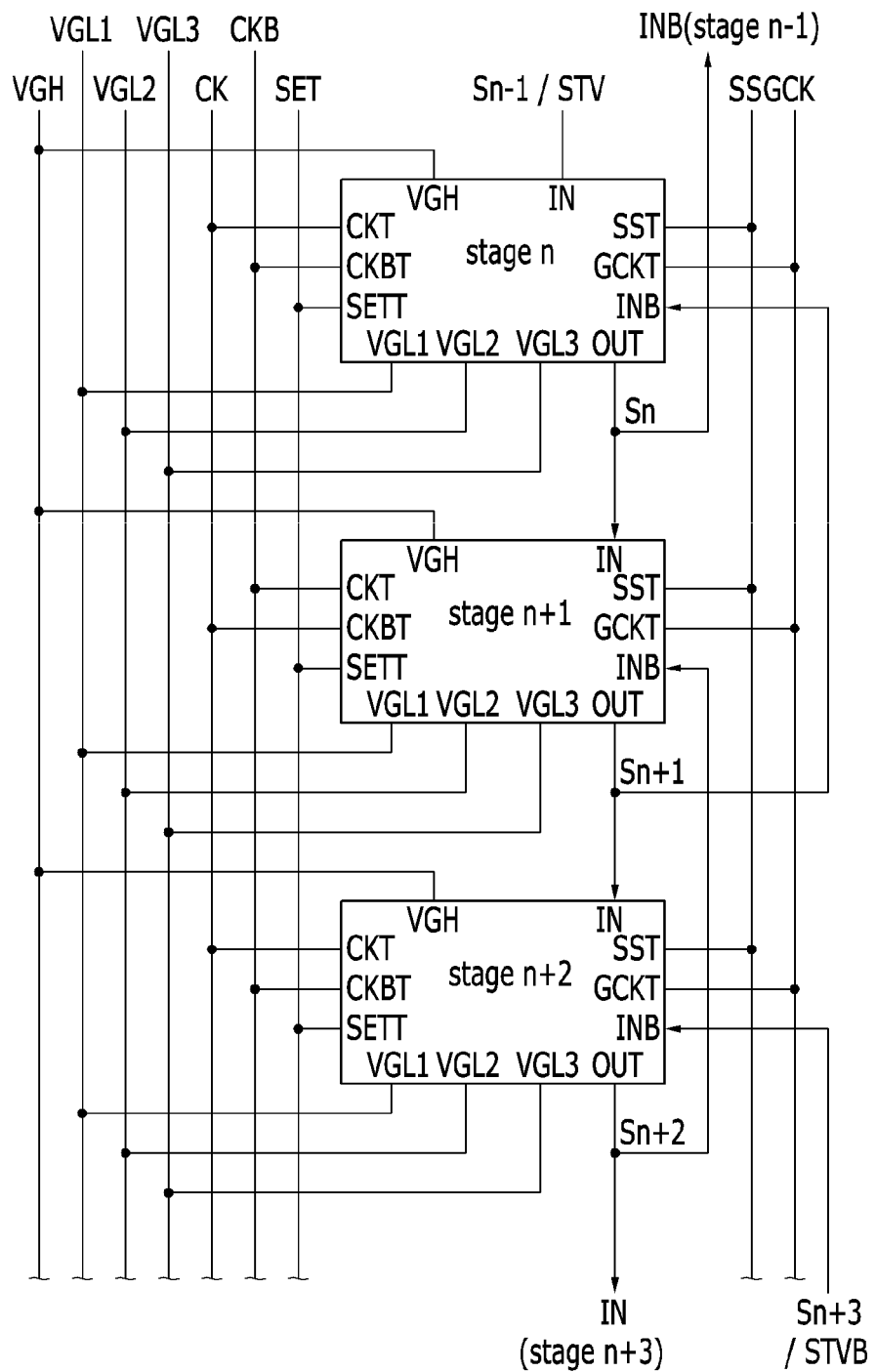
FIG. 2 is a block diagram showing stages of an exemplary embodiment of a scan driving device of FIG. 1.

FIG. 2 is a block diagram showing stages of an exemplary embodiment of the scan driver 20 of FIG. 1.

In an exemplary embodiment, as shown in FIG. 2, the scan driver includes a plurality of shift registers that generates a plurality of scan signals (gate signal) and outputs the scan signals. FIG. 2 shows only three stages, e.g., an n-th stage (stage n), an (n+1)-th stage (stage n+1) and an (n+2)-th stage (stage n+2) of the shift registers, for convenience of illustration. Here, n is a natural number equal to or less than 1−2.

Each shift register includes seven input terminals, one output terminal and connection terminals of a plurality of driving power source voltages.

In an exemplary embodiment, each input terminal of the shift register includes a forward direction driving signal terminal IN, a backward direction driving signal terminal INB, a sustain signal terminal SETT, a clock signal terminal CKT, a clock bar signal terminal CKBT, a control signal terminal SST and a gate clock signal terminal GCKT. In such an embodiment, each shift register includes an output signal terminal OUT for outputting the scan signal generated to correspond to each stage as the output terminal.

In an exemplary embodiment, each shift register is connected to a plurality of power source voltage supply wires, and receives the driving power source voltages from the power source terminals of a plurality of power source voltage supply units (not shown) through power source voltage supply wires to be driven.

In such an embodiment, the driving power source voltages may include two or more power source voltages having different voltage levels. According to an exemplary embodiment, as shown in FIG. 2, the driving power source voltages include a high potential power source voltage VGH having a predetermined high voltage level, and a first low potential power source voltage VGL1, a second low potential power source voltage VGL2 and a third low potential power source voltage VGL3, which have different predetermined low voltage levels from each other.

In one exemplary embodiment, for example, a voltage level of the second low potential power source voltage VGL2 may be lower than a voltage level of the first low potential power source voltage VGL1, and higher than a voltage level of the third low potential power source voltage VGL3, but not being limited thereto.

The voltage levels of the driving power source voltages are not limited to particular voltage levels. In one exemplary embodiment, for example, the high potential power source voltage VGH may have a voltage level in a range of about 12 volts (V) to about 15 V, the first low potential power source voltage VGL1 may have a voltage level in a range of about −3 V, the second low potential power source voltage VGL2 may have a voltage level in a range of about −5 V, and the third low potential power source voltage VGL3 may have a voltage level in a range of about −7 V.

In an exemplary embodiment, as shown in FIG. 2, the driving power source voltages having different voltage levels may be transferred from the power source terminals (not shown) through the power source voltage supply wires connected to every shift register.

In an exemplary embodiment, the forward direction driving signal terminal IN of a stage (also referred to as a current stage) receives a pulse voltage of an output signal (e.g., a scan signal) outputted from the output signal terminal OUT of a prior stage thereof to initiate driving of the current stage. Accordingly, when the scan driver operates in a forward direction driving, the scan driver is driven by sequentially applying the output signal of the current stage to the forward direction driving signal terminal IN of a next stage thereof. An output signal Sn−1 of the shift register of an (n−1)-th stage (stage n−1) is inputted to the forward direction driving signal terminal IN of the shift register of the n-th stage (stage n), which is the next stage of the (n−1)-th stage (stage n−1). When the n-th stage (stage n) is a first stage of the scan driver, a start signal STV is transferred to the forward direction driving signal terminal IN of the shift register of the first stage to initiate the forward direction driving.

In an exemplary embodiment, the backward direction driving signal terminal INB of the current stage receives the pulse voltage of the output signal (e.g., the scan signal) outputted from the output signal terminal OUT of a next stage thereof to initiate driving of the current stage. Accordingly, when the scan driver operates in a backward direction driving, the scan driver is driven by sequentially applying the output signals of the a stage to the backward direction driving signal terminal INB of a next stage thereof. An output signal Sn+3 of the shift register of a n+3-th stage (stage n+3), which is a next stage of the (n+2)-th stage (stage n+2), is inputted to the backward direction driving signal terminal INB of the shift register of the (n+2)-th stage (stage n+2). When the (n+2)-th stage is a last stage of the scan driver, a start bar signal STVB is transferred to the backward direction driving signal terminal INB of the shift register of the last stage to initiate backward direction driving.

In an exemplary embodiment, the sustain signal terminal SETT receives a sustain signal SET, which is transferred to a transistor of circuit elements of each shift register to control a switching operation of the transistor. In such an embodiment, the sustain signal SET may be inputted before driving of the scan driver is initiated. Therefore, the sustain signal SET may turn on the transistor of the circuit elements of each shift register of the scan driver to maintain a predetermined node voltage therein. In one exemplary embodiment, for example, the predetermined node voltage may be maintained at any one driving power source voltage of the driving power source voltages by the sustain signal SET.

In an exemplary embodiment of a scan driving device, a clock signal CK and a clock bar signal CKB are transferred to the clock signal terminal CKT and the clock bar signal terminal CKBT, respectively, of each shift register.

In an exemplary embodiment, the clock signal CK and the clock bar signal CKB may be sequentially and alternately transferred to the clock signal terminal CKT and the clock bar signal terminal CKBT of the shift register of each stage every shift register.

In such an embodiment, as shown in FIG. 2, the clock signal CK is transferred to the clock signal terminal CKT and the clock bar signal CKB is transferred to the clock bar signal terminal CKBT of the shift register of the n-th stage (stage n). In such an embodiment, the clock bar signal CKB is transferred to the clock signal terminal CKT and the clock signal CK is transferred to the clock bar signal terminal CKBT of the n+1-th shift register (stage n+1), which is the next stage.

In subh an embodiment, as described above, the clock signal CK and the clock bar signal CKB having a phase difference of half a period are repeatedly inputted to the clock signal terminal CKT and the clock bar signal terminal CKBT every stage of the shift register with changed pattern, e.g., the clock signal CK to the clock signal terminal CKT and the clock bar signal CKB to the clock bar signal terminal CKBT of a stage, and the clock signal CK to the clock bart signal terminal CKBT and the clock bar signal CKB to the clock signal terminal CKT of another stage (e.g., the prior or next stage).

In an exemplary embodiment, the control signal terminal SST of the shift register of each stage receives a predetermined control signal SS in response to a driving process of the scan driving device. In such an embodiment, the control signal SS may control the switching operation of a predetermined transistor of the circuit elements of the shift register such that the output signals (e.g., the scan signals) generated in the scan driving device are simultaneously outputted.

In an exemplary embodiment, the gate clock signal terminal GCKT of the shift register of each stage receives a predetermined gate clock signal GCK in response to the driving process of the scan driving device. In such an embodiment, the gate clock signal GCK may control a voltage waveform of the output signal (e.g., the scan signal) during a period where the output signals (e.g., the scan signals) generated in the scan driving device are simultaneously outputted. In such an embodiment, the gate clock signal GCK may be transferred during a period where the control signal SS is transferred at a level of voltage for turning-on a switch of the circuit element of the shift register (e.g., the level of the gate-on voltage of the transistor) to determine a pulse voltage of each of the output signals (scan signal) of the shift registers. According to an exemplary embodiment, in a driving process of sequentially or simultaneously outputting the output signals of the scan driving device, when the output signals are simultaneously outputted, the pulse voltage of the output signal is determined based on the pulse voltage of the gate clock signal GCK inputted to the shift register.

In an exemplary embodiment, the output signal terminal OUT of the shift register of each stage outputs the simultaneously or sequentially generated output signal. The output signals (e.g., the scan signals) outputted from the shift register of each stage is transferred to the pixels in each pixel row of the display unit through the corresponding scan line (not shown in FIG. 2).

In such an embodiment, the output signal terminal OUT of the shift register of each stage is connected to the forward direction driving signal terminal IN of the shift register of the next stage thereof such that the pulse voltage of the generated output signal (scan signal) is transferred as an input signal of the forward direction driving signal terminal IN of the shift register of the next stage when the driving direction of the scan driving device is a forward direction. In an exemplary embodiment, the output signal terminal OUT of the shift register of each stage is connected to the backward direction driving signal terminal INB of the shift register of the prior stage thereof. Therefore, when the driving direction of the scan driving device is a backward direction, the pulse voltage of the output signal (scan signal) generated in the shift register of each stage is transferred as an input signal of the backward direction driving signal terminal INB of the shift register of the prior stage.

In an exemplary embodiment, as shown in FIG. 2, the output signal (scan signal) $Sn+1$ generated from the output signal terminal OUT of the shift register of the n+1-th stage (stage n+1) is transferred to the pixels in a (n+1)-th pixel row of the display unit through a (n+1)-th scan line (not shown) of the scan lines. In such an embodiment, the output signal terminal OUT of the shift register of the n+1-th stage (stage n+1) is connected to the forward direction driving signal terminal IN of the shift register of the n+2-th stage (stage n+2), which is the next stage of (n+1)-th stage, and to the backward direction driving signal terminal INB of the shift register of the n-th stage (stage n), which is the prior stage of the (n+1)-th stage.

Therefore, in such an embodiment, when driven in the forward direction driving, the output signal $Sn+1$ output from the output signal terminal OUT of the shift register of the (n+1)-th stage (stage n+1) is inputted to the forward direction driving signal terminal IN of the shift register (stage n+2) of the (n+2)-th stage, and when driven in the backward direction driving, the output signal $Sn+1$ output from the output signal terminal OUT of the shift register of the (n+1)-th stage (stage n+1) is inputted to the backward direction driving signal terminal INB of the shift register of the n-th stage (stage n).

Figure 3:
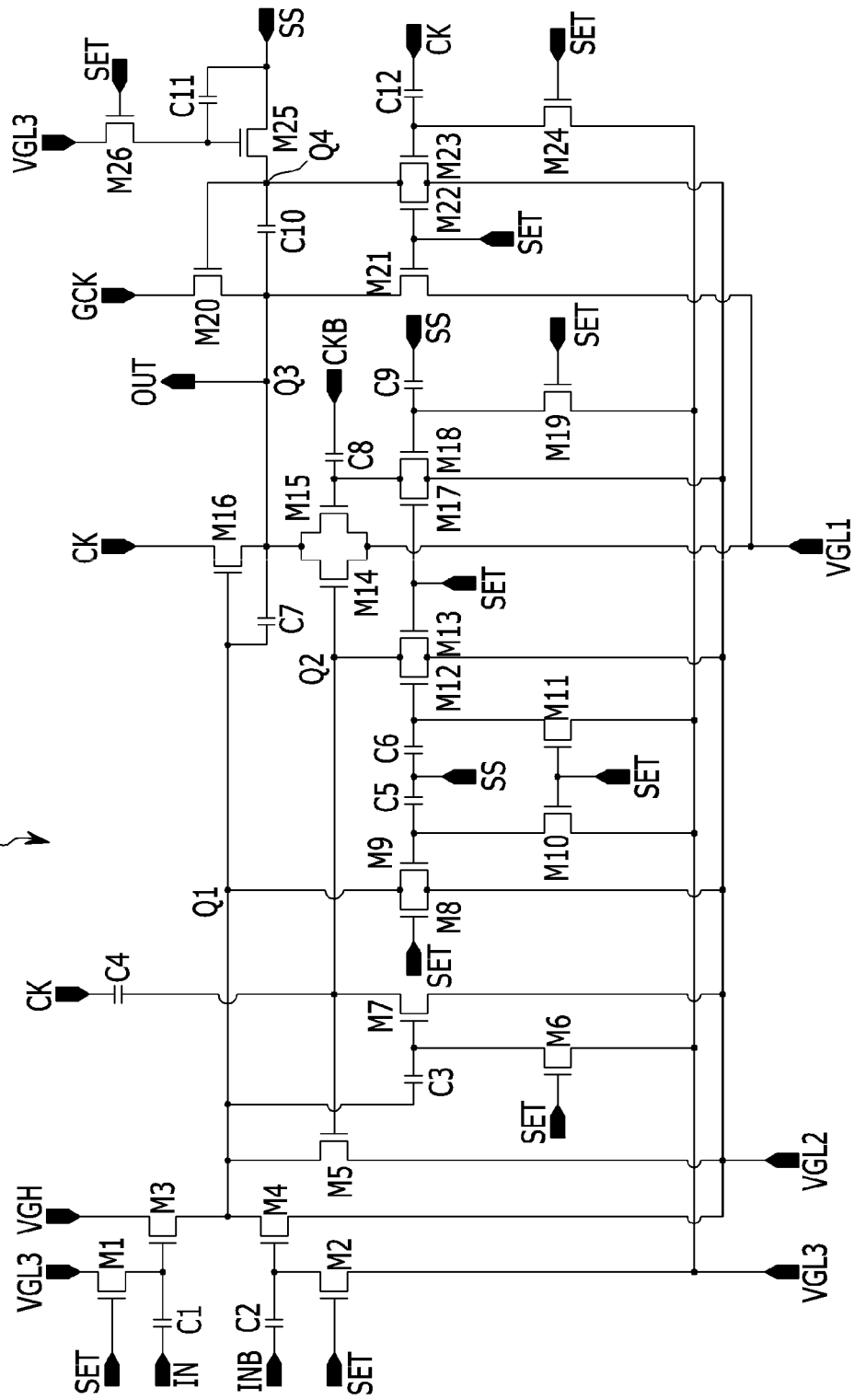
FIGS. 3 and 4 are circuit diagrams showing an exemplary embodiment of a stage of the scan driving device of FIG. 2.
Figure 4:
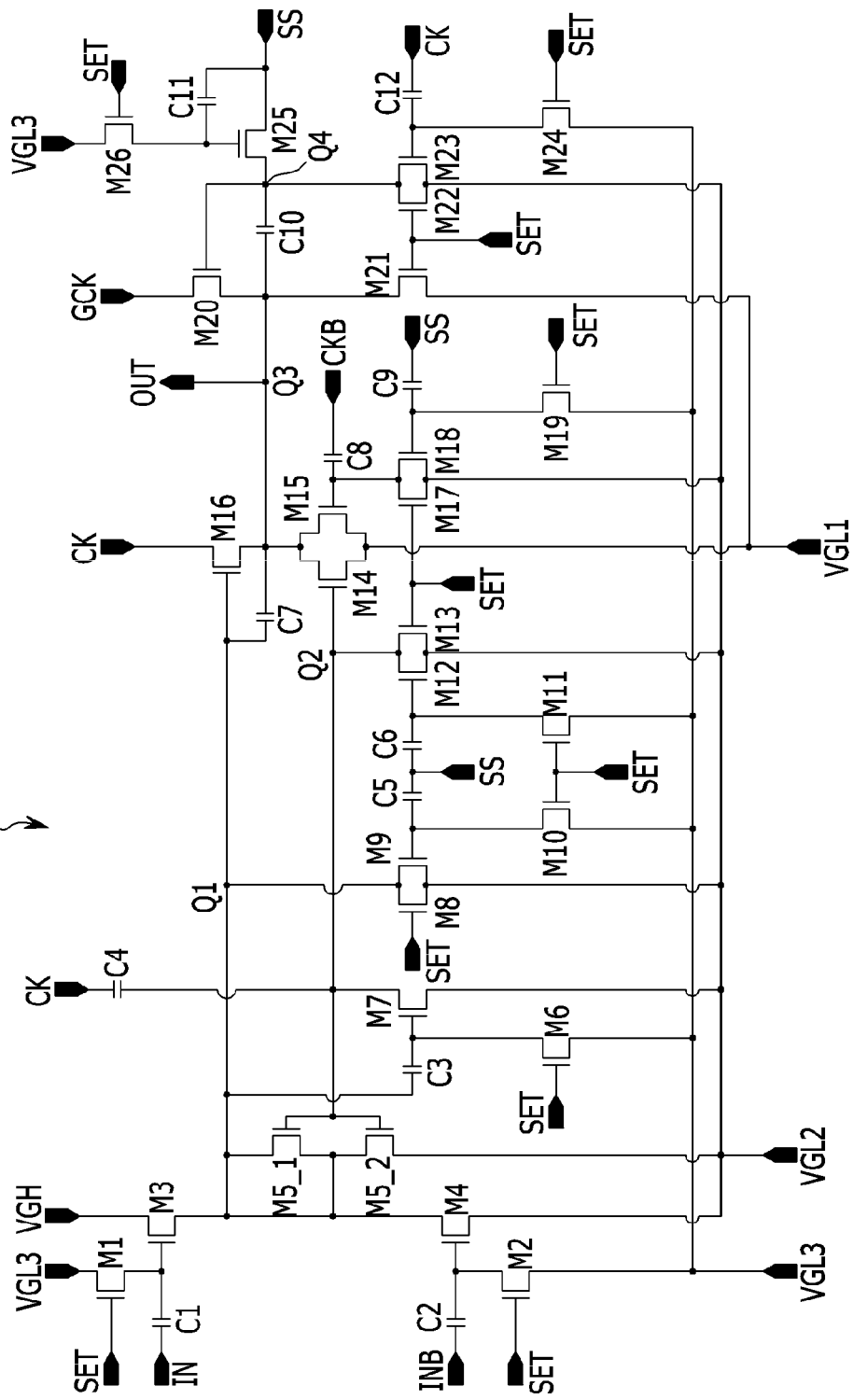

FIGS. 3 and 4 are circuit diagrams showing an exemplary embodiment of a stage of the scan driving device of FIG. 2.

FIGS. 3 and 4 shows different exemplary embodiments of a stage, and FIGS. 3 and 4 each shows a structure of the shift register of a stage of the shift registers of the scan driving device, for example, the shift register of the n-th stage (also referred to as "n-th shift register") of FIG. 2.

Hereinafter, connection of the input terminals and the output terminal of the n-th shift register (stage n) and the signals inputted to or outputted from each terminal will be described in detail with reference to FIGS. 3 and 4. In FIGS. 3 and 4, a circuit structure of a shift register will be described based on the signals inputted to or outputted from each terminal of the shift register of the n-th stage. The circuit structure of the shift register of FIG. 4 is substantially the same as The circuit structure of the shift register of FIG. 3 except a fifth transistor M5. The same or like elements shown in FIG. 4 have been labeled with the same reference characters as used above to describe the exemplary embodiment of the n-th stage shown in FIG. 3, and any repetitive detailed description thereof will be omitted.

Referring to FIG. 3, an exemplary embodiment of the shift register of the n-th stage of the scan driving device includes 26 transistors, e.g., first to twenty-sixth transistors, and 12 capacitors, e.g, first to twelfth transistors, but the invention is not limited thereto. In an alternative exemplary embodiment, circuit constitution of a stage may be different from the circuit constitution on the stage shown in FIG. 3. The transistor of a shift register of the scan driving device may be a p-type metal oxide semiconductor ("PMOS") transistor or an n-type metal oxide semiconductor ("NMOS") transistor.

In an exemplary embodiment, as shown in FIG. 3, the first transistor M1 of the shift register of the n-th stage (stage n) includes a gate electrode that which receives the sustain signal SET through the sustain signal terminal, a first electrode that receives the third low potential power source voltage VGL3, and a second electrode connected to the gate electrode of the third transistor M3. The transistor M1 transfers the third low potential power source voltage when the transistor M1 is turned on in response to the sustain signal SET.

The second transistor M2 includes the gate electrode that receives the sustain signal SET through the sustain signal terminal, the first electrode that receives the third low potential power source voltage VGL3, and the second electrode connected to the gate electrode of the fourth transistor M4. The second transistor M2 transfers the third low potential power source voltage when the second transistor M2 is turned on in response to the sustain signal SET.

The third transistor M3 includes the gate electrode that receives the output signal Sn−1 of the shift register of the n−1-th stage (stage n−1), which is the prior stage thereof, through the forward direction driving signal terminal as the input signal of the forward direction driving signal terminal IN, the first electrode that receives the high potential power source voltage VGH, and the second electrode connected to a first node Q1. The third transistor M3 transfers the high potential power source voltage VGH to the first node Q1 when the third transistor M3 is turned on in response to the input signal of the forward direction driving signal terminal IN. In an exemplary embodiment of the shift register of the first stage, the input signal of the forward direction driving signal terminal IN inputted to the gate electrode of the transistor M3 is a start signal STV of forward direction driving.

Both electrodes of the first capacitor C1 are connected to and between the forward direction driving signal terminal and the third transistor M3, respectively, to maintain a gate electrode voltage of the third transistor M3 during a predetermined period.

The fourth transistor M4 includes the gate electrode that receives the output signal Sn+1 of the shift register of the n+1-th (stage n+1) stage, which is the next stage thereof, the first electrode that receives the second low potential power source voltage VGL2, and the second electrode connected to the node Q1. The fourth transistor M4 transfers the second low potential power source voltage VGL2 to the first node Q1 when the fourth transistor M4 is turned on. In an exemplary embodiment of the shift register of the last stage, the input signal inputted to the gate electrode of the transistor M4 is the start signal of backward direction driving, e.g., the start bar signal STVB.

Both electrodes of the second capacitor C2 are connected to and between the backward direction driving signal terminal and the fourth transistor M4, respectively the fourth transistor M4 to maintain the gate electrode voltage of the fourth transistor M4 during a predetermined period.

The fifth transistor M5 includes the gate electrode connected to a second node Q2, the first electrode that receives the second low potential power source voltage VGL2, and the second electrode connected to the first node Q1. The fifth transistor M5 transfers the second low potential power source voltage VGL2 to the first node Q1 when the fifth transistor M5 is turned on in response to the voltage applied to the second node Q2. Referring to FIG. 4, in an alternative exemplary embodiment, a plurality of fifth transistors M5_1 and M5_2 may be connected in series. In such an embodiment, as shown in FIG. 4, when the fifth transistors M5_1 and M5_2 are connected in series to be used as a dual gate, a leakage current flowing downwardly may be effectively prevented to efficiently hold a high level voltage of the first node Q1.

In an exemplary embodiment, the sixth transistor M6 includes the gate electrode that receives the sustain signal SET through the sustain signal terminal, the first electrode that receives the third low potential power source voltage VGL3, and the second electrode connected to the gate electrode of the seventh transistor M7. The sixth transistor M6 transfers the third low potential power source voltage VGL3 to the gate electrode of the seventh transistor M7 when the sixth transistor M6 is turned on in response to the sustain signal SET.

The sixth transistor M7 includes the gate electrode connected to the first node Q1 to receive the voltage applied to the first node Q1, the first electrode that receives the second low potential power source voltage VGL2, and the second electrode connected to the second node Q2. The seventh transistor M7 transfers the second low potential power source voltage VGL2 to the second node Q2 when the seventh transistor M7 is turned on in response to the voltage applied to the first node Q1.

Both electrodes of the third capacitor C3 are connected to and between the first node Q1 and the seventh transistor M7, respectively to maintain the gate electrode voltage of the seventh transistor M7 during a predetermined period.

In such an embodiment, both electrodes of the fourth capacitor C4 are connected to and between the clock signal terminal and the second node Q2 to maintain a voltage level corresponding to a difference between the pulse voltage of the clock signal CK or the clock bar signal CKB inputted from the clock signal terminal and the voltage applied to the node Q2 during a predetermined period.

The eighth transistor M8 includes the gate electrode that receives the sustain signal SET through the sustain signal terminal, the first electrode that receives the second low potential power source voltage VGL2, and the second electrode connected to the first node Q1. The transistor M8 transfers the second low potential power source voltage VGL2 to the first node Q1 when the eighth transistor M8 is turned on in response to the sustain signal SET.

The ninth transistor M9 includes the gate electrode that receives the control signal SS through the control signal terminal, the first electrode that receives the second low potential power source voltage VGL2, and the second electrode connected to the first node Q1. The ninth transistor M9 transfers the second low potential power source voltage VGL2 to the first node Q1 when the ninth transistor M9 is turned on in response to the control signal SS. In such an embodiment, the voltage transferred from the tenth transistor M10 when the tenth transistor M10 is turned on may be applied to the gate electrode of the ninth transistor M9. Both electrodes of the fifth capacitor C5 are connected to and between the gate electrode of the ninth transistor M9 and the control signal terminal, respectively, to maintain the voltage applied to the gate electrode of the ninth transistor M9.

The tenth transistor M10 includes the gate electrode that receives the sustain signal SET through the sustain signal terminal, the first electrode that receives the third low potential power source voltage VGL3, and the second electrode connected to the gate electrode of the ninth transistor M9. The tenth transistor M10 transfers the third low potential power source voltage VGL3 to the gate electrode of the ninth transistor M9 when the tenth transistor M10 is turned on in response to the sustain signal SET.

The eleventh transistor M11 includes the gate electrode that receives the sustain signal SET through the sustain signal terminal, the first electrode that receives the third low potential power source voltage VGL3, and the second electrode connected to the gate electrode of the twelfth transistor M12. The eleventh transistor M11 transfers the third low potential power source voltage VGL3 to the gate electrode of the twelfth transistor M12 when the eleventh transistor M11 is turned on in response to the sustain signal SET.

The twelfth transistor M12 includes the gate electrode that receives the control signal SS through the control signal terminal, the first electrode that receives the second low potential power source voltage VGL2, and the second electrode connected to the second node Q2. The twelfth transistor M12 transfers the second low potential power source voltage VGL2 to the second node Q2 when the twelfth transistor M12 is turned on in response to the control signal SS. In such an embodiment, when the eleventh transistor M11 is turned on, the voltage transferred from the eleventh transistor M11 may be applied to the gate electrode of the twelfth transistor M12. In such an embodiment, both electrodes of the sixth capacitor C6 are connected to and between the gate electrode of the transistor M12 and the control signal terminal, respectively, to maintain the voltage applied to the gate electrode of the twelfth transistor M12.

The thirteenth transistor M13 includes the gate electrode that receives the sustain signal SET through the sustain signal terminal, the first electrode that receives the second low potential power source voltage VGL2, and the second electrode connected to the second node Q2. The thirteenth transistor M13 transfers the second low potential power source voltage VGL2 to the section node Q2 when the thirteenth transistor M13 is turned on in response to the sustain signal SET.

The fourteenth transistor M14 includes the gate electrode connected to the second node Q2, the first electrode that receives the first low potential power source voltage VGL1, and the second electrode connected to a third node Q3. The fourteenth transistor M14 transfers the first low potential power source voltage to VGL1 the third node Q3 when the fourteenth transistor M14 is turned on in response to the voltage applied to the second node Q2.

The fifteenth transistor M15 includes the gate electrode connected to the clock bar signal terminal to receive the clock bar signal CKB, the first electrode that receives the first low potential power source voltage VGL1, and the second electrode connected to the third node Q3. The fifteenth transistor M15 transfers the first low potential power source voltage VGL1 to the third node Q3 when the fifteenth transistor M15 is turned on in response to the clock bar signal CKB.

In such an embodiment, the output signal terminal is connected to the third node Q3. Accordingly, the output signal OUT is generated by setting the voltage transferred to the third node Q3 in a pulse waveform of the output signal.

Both electrodes of the eighth capacitor C8 are connected to and between the clock bar signal terminal and the gate electrode of the fifteenth transistor M15, respectively, such that the voltage applied to the gate electrode of the fifteenth transistor M15 is maintained.

In such an embodiment, the sixteenth transistor M16 includes the gate electrode connected to the first node Q1, the first electrode that receives the clock signal CK through the clock signal terminal, and the second electrode connected to the third node Q3. The sixteenth transistor M16 transfers the voltage of the clock signal CK to the third node Q3 when the sixteenth transistor M16 is turned on in response to the voltage applied to the first node Q1. Accordingly, the output signal OUT transferred through the third node Q3 is generated by setting the voltage of the clock signal CK transferred when the sixteenth transistor M16 is turned on in a pulse waveform of the output signal.

Both electrodes of the seventh capacitor C7 are connected to and between the gate electrode and second electrode of the sixteenth transistor M16, and a difference between voltages applied to the both electrodes of the seventh capacitor C7 is maintained. Accordingly, the seventh capacitor C7 generates the output signal OUT based on the clock signal CK by maintaining a switching turn-on operation of the sixteenth transistor M16 during a predetermined period where the sixteenth transistor M16 is turned on.

The seventeenth transistor M17 includes the gate electrode that receives the sustain signal SET applied through the sustain signal terminal, the first electrode connected to the second low potential power source voltage VGL2, and the second electrode connected to the gate electrode of the fifteenth transistor M15. The transistor M17 transfers the second low potential power source voltage VGL2 to the gate electrode of the fifteenth transistor M15 when the seventeenth transistor M17 is turned on in response to the sustain signal SET.

The eighteenth transistor M18 includes the gate electrode that receives the control signal SS applied through the control signal terminal, the first electrode connected to the second low potential power source voltage VGL2, and the second electrode connected to the gate electrode of the fifteenth transistor M15. The transistor M18 transfers the second low potential power source voltage VGL2 to the gate electrode of the fifteenth transistor M15 when the eighteenth transistor M18 is turned on in response to the control signal SS. In such an embodiment, both electrodes of the ninth capacitor C9 are connected to and between the control signal terminal and the gate electrode of the eighteenth transistor M18 to maintain the voltage applied to the gate electrode of the eighteenth transistor M18 during a predetermined period.

The nineteenth transistor M19 includes the gate electrode that receives the sustain signal SET applied through the sustain signal terminal, the first electrode connected to the third low potential power source voltage VGL3, and the second electrode connected to the gate electrode of the eighteenth transistor M18. The nineteenth transistor M19 transfers the third low potential power source VGL3 voltage to the gate electrode of the eighteenth transistor M18 when the nineteenth transistor M19 is turned on in response to the sustain signal SET.

The twentieth transistor M20 includes the gate electrode connected to a fourth node Q4, the first electrode that receives the gate clock signal GCK through the gate clock signal terminal, and the second electrode connected to the third node Q3. The twentieth transistor M20 transfers the pulse voltage of the gate clock signal GCK to the third node Q3 when the transistor M20 is turned on in response to the voltage applied to the fourth node Q4. The output signal terminal is connected to the third node Q3. Accordingly, a pulse voltage waveform of the output signal OUT is generated according to the pulse voltage of the gate clock signal GCK when the twentieth transistor M20 is turned on.

In such an embodiment, both electrodes of the tenth capacitor C10 are connected to the third node Q3 (the second electrode of the twentieth transistor M20) and the fourth node Q4 and a difference between voltages of the both electrodes of the tenth capacitor C10 is maintained during a predetermined period. Accordingly, the gate electrode voltage of the twentieth transistor M20 may be maintained during a predetermined period.

in such an embodiment, the twenty-first transistor M21 includes the gate electrode that receives the sustain signal SET applied through the sustain signal terminal, the first electrode connected to the first low potential power source voltage VGL1, and the second electrode connected to the third node Q3. The twenty-first transistor M21 transfers the first low potential power source voltage VGL1 to the third node Q3 when the twenty-first transistor M21 is turned on in response to the voltage applied to the sustain signal SET.

The twenty-second transistor M22 includes the gate electrode that receives the sustain signal SET applied through the sustain signal terminal, the first electrode connected to the second low potential power source voltage VGL2, and the second electrode connected to the fourth node Q4. The twenty-second transistor M22 transfers the second low potential power source voltage VGL2 to the fourth node Q4 when the twenty-second transistor M22 is turned on in response to the voltage applied to the sustain signal SET.

The twenty-third transistor M23 includes the gate electrode that receives the clock signal CK applied through the clock signal terminal, the first electrode connected to the second low potential power source voltage VGL2, and the second electrode connected to the fourth node Q4. The twenty-third transistor M23 transfers the second low potential power source voltage VGL2 to the fourth node Q4 when the twenty-third transistor M23 is turned on in response to the clock signal CK.

In such an embodiment, both electrodes of the twelfth capacitor C12 are connected to the clock signal terminal and the gate electrode of the twenty-third transistor M23. Accordingly, the gate electrode voltage of the twenty-third transistor M23 may be maintained during a predetermined period.

In such an embodiment, the twenty-fourth transistor M24 includes the gate electrode that receives the sustain signal SET applied through the sustain signal terminal, the first electrode connected to the third low potential power source voltage VGL3, and the second electrode connected to the gate electrode of the twenty-third transistor M23. The twenty-fourth transistor M24 transfers the third low potential power source voltage VGL3 to the gate electrode of the twenty-third transistor M23 when the twenty-fourth transistor M24 is turned on in response to the sustain signal SET.

Twenty-fifth transistor M25 includes the gate electrode connected to one electrode of the twenty-sixth transistor M26, the first electrode that receives the control signal SS applied through the control signal terminal, and the second electrode connected to the fourth node Q4. The twenty-fifth transistor M25 transfers the voltage of the control signal SS to the fourth node Q4 when the twenty-fifth transistor M25 is turned on in response to the voltage transferred through the twenty-sixth transistor M26.

Both electrodes of the eleventh capacitor C11 are connected to and between the gate electrode and the first electrode of the twenty-fifth transistor M25, and a difference between voltages of the both electrodes of the eleventh capacitor C11 is stored and maintained. Therefore, the eleventh capacitor C11 may maintain the gate electrode voltage of the twenty-fifth transistor M25 during a predetermined period.

Meanwhile, the twenty-sixth transistor M26 includes the gate electrode that receives the sustain signal SET applied through the sustain signal terminal, the first electrode connected to the third low potential power source voltage VGL3, and the second electrode connected to the gate electrode of the twenty-fifth transistor M25. The twenty-sixth transistor M26 transfers the third low potential power source voltage VGL3 to the gate electrode of the twenty-fifth transistor M25 when the twenty-sixth transistor M26 is turned on in response to the sustain signal SET.

In an exemplary embodiment, the transistor of the scan driving device may be an NMOS transistor, but not being limited thereto.

Figure 5:
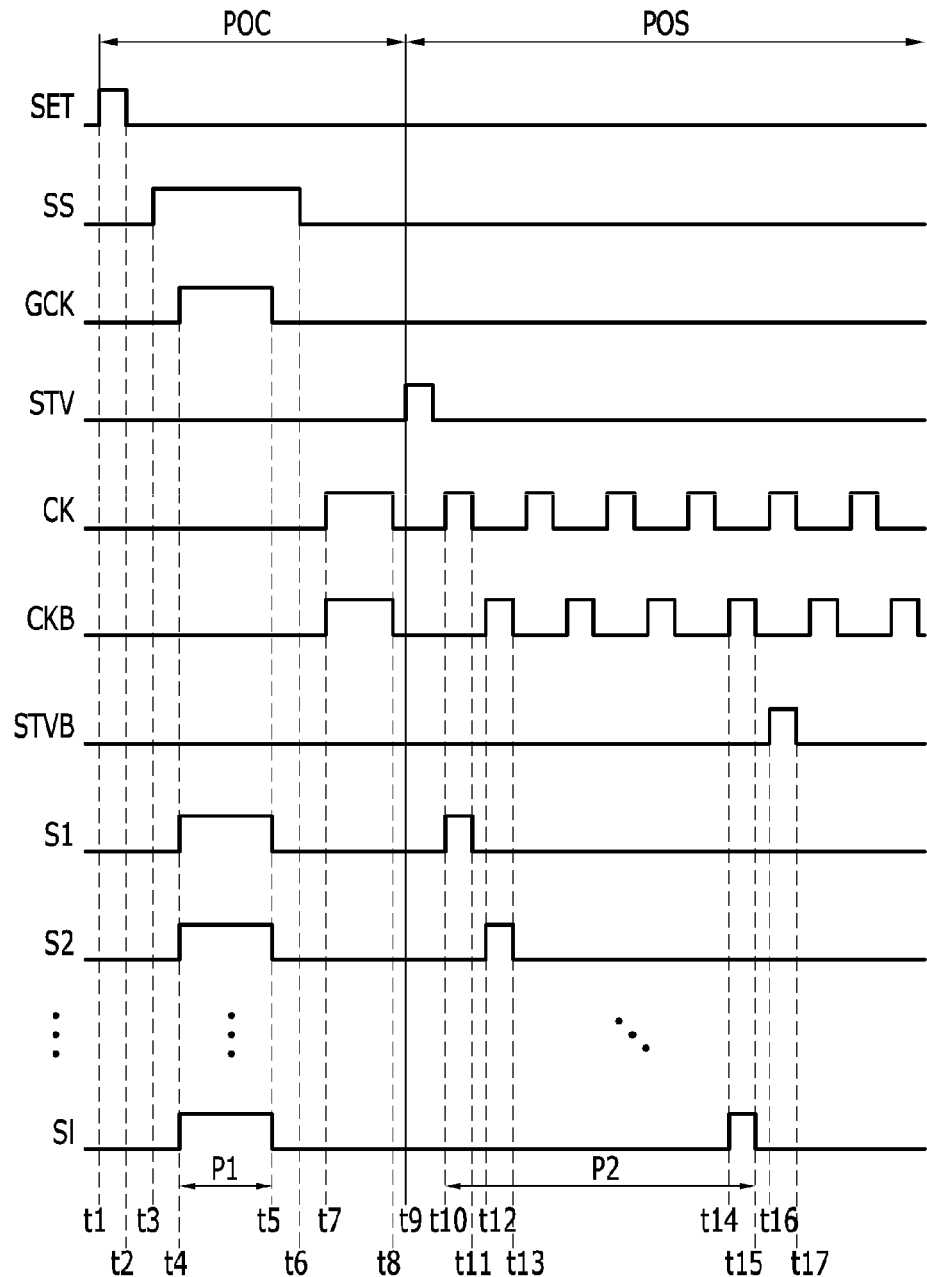
FIG. 5 is a signal timing diagram showing signals for an operation of the scan driving device of FIGS. 3 and 4.

FIG. 5 is a signal timing diagram showing signal for an operation of the scan driving device of FIGS. 3 and 4. The shift register structure of the n-th stage of the scan driving device of FIG. 4 is substantially the same as the shift register structure of the n-th stage of the scan driving device of FIG. 3, except for the transistor M5, and the operation of the signal scan driver will be described with reference to the circuit structure of the stage shown in FIG. 3.

The signals shown in FIG. 5 are signals of an exemplary embodiment where transistors of the scan driving device of FIGS. 3 and 4 includes a NMOS transistor, and have a high level as a gate-on voltage level.

A driving section (e.g., a unit driving time period for driving the scan lines S1-Sn) of the operation of the scan driving device, as shown in the signal timing diagram of FIG. 5, may be divided into a simultaneous driving section POC, in which the output signals (e.g., the scan signals) are simultaneously generated, and a sequential driving section POS, in which the output signals (e.g., the scan signals) are sequentially generated to the scan lines S1-Sn in the scan driving device corresponding to the pixel rows.

In an exemplary embodiment, as shown in FIG. 5, before the scan driving device starts to be driven, the sustain signal SET is converted into a high level at a first time point t1 and applied while being maintained at the high level until a second time point t2. In such an embodiment, as shown in FIG. 5, the sustain signal SET applied at the high level may be in the simultaneous driving section POC, but not being limited thereto. In an exemplary embodiment, substantially immediately before the simultaneous driving section POC or the sequential driving section POS starts, the sustain signal SET may be applied at the high level to maintain a predetermined node voltage of the scan driving device substantially at a constant voltage level.

In an exemplary embodiment, referring back to FIG. 3, each of the first, second, sixth, eighth, tenth, eleventh, thirteenth, seventeenth, nineteenth, twenty-fourth and twenty-sixth transistors M1, M2, M6, M8, M10, M11, M13, M17, M19, M24 and M26 is turned on in response to the sustain signal SET transferred at the high level during the first time point t1 to the second time point t2.

Therefore, the third low potential power source voltage VGL3 is applied to the gate electrode of the third transistor M3 by the turned-on first transistor M1. The third low potential power source voltage VGL3 is applied to the gate electrode of the fourth transistor M4 by the turned-on second transistor M2. Accordingly, both the third and fourth transistors M3 and M4 are turned-off.

In such an embodiment, the third low potential power source voltage VGL3 is applied to the gate electrode of the seventh transistor M7 by the turned-on sixth transistor M6, and the seventh transistor M7 is thereby turned-off. The second low potential power source voltage VGL2 is transferred to the first node Q1 by the turned-on eighth transistor M8, and the sixteenth transistor M16 is thereby turned-off.

In such an embodiment, the ninth and twelfth transistors M9 and M12 that receive the third low potential power source voltage VGL3 by the turned-on tenth and eleventh transistors M10 and M11 are turned-off, and the second low potential power source voltage VGL2 is transferred to the second node Q2 by the turned-on thirteenth transistor M13, such that the fourteenth transistor M14 is turned off.

The second low potential power source voltage VGL2 is transferred to the gate electrode of the fifteenth transistor M15 by the turned-on seventeenth transistor M17 such that the fifteenth transistor M15 is turned off.

The third low potential power source voltage VGL3 is transferred to the gate electrode of the eighteenth transistor M18 by the turned-on nineteenth transistor M19 such that the transistor M18 is turned off.

The third low potential power source voltage VGL3 is transferred to the gate electrode of the twenty-third transistor M23 by the turned-on twenty-fourth transistor M24 such that the twenty-third transistor M23 is turned off.

The third low potential power source voltage VGL3 is transferred to the gate electrode of the twenty-fifth transistor M25 by the turned-on twenty sixth transistor M26 such that t the twenty-fifth transistor M25 is turned off.

After the sustain signal SET is transferred at the high level during the first time point t1 to the second time point t2, the control signal SS is converted into the high level at a third time point t3 and maintained at the high level until a sixth time point t6.

The eighteenth transistor M18 and the twenty-fifth transistor M25 that receive the pulse voltage of the control signal SS are turned-on during the period of the third time point t3 to the sixth point t6. When the eighteenth transistor M18 is turned on, the second low potential power source voltage VGL2 is transferred to the gate electrode of the fifteenth transistor M15 through the turned-on eighteenth transistor M18. The second low potential power source voltage VGL2, which is a voltage at a low level, turns off the fifteenth transistor M15. When the twenty-fifth transistor M25 is turned on, the pulse voltage of the control signal SS, which is applied to the first electrode of the twenty-fifth transistor M25, is transferred to the fourth node Q4. In an exemplary embodiment, the pulse voltage of the control signal SS is at a high level, and the twentieth transistor M20, to which the voltage of the fourth node Q4 is transferred, is thereby turned on. When the twentieth transistor M20 is turned on, the pulse voltage of the gate clock signal GCK is transferred to the third node Q3 and outputted as the pulse voltage of the output signal OUT. The gate clock signal GCK is transferred at the high level voltage during the period between fourth and fifth time points t4 and t5. Accordingly, the output signal outputted during the period between fourth and fifth time points t4 and t5, that is, an output voltage waveform of the scan signal becomes the high level voltage. A plurality of output signals generated in the shift registers of the stages of the scan driving device during the period between the fourth and fifth points t4 and t5, that is, the scan signals S1 to Sn, are all simultaneously outputted at the high level based on the gate clock signal GCK. Therefore, the period between the fourth and fifth time points t4 and t5 may be referred to as a simultaneous output period P1.

In such an embodiment, after the simultaneous output period P1 elapses, the clock signal CK and the clock bar signal CKB applied to each shift register of the scan driving device are transferred at the high level voltage during the period between seventh and eighth time points t7 and t8.

The voltage of the second node Q2 is changed into a high level by the clock signal CK. Then, the fifth transistor M5 and the fourteenth transistor M14 connected to the second node Q2 are turned-on. The second low potential power source voltage VGL2 is applied to the first node Q1 by the turned-on fifth transistor M5 to maintain the sixteenth transistor M16 to be turned off. Further, the first low potential power source voltage VGL1 is transferred to the third node Q3 by the turned-on fourteenth transistor M14. Accordingly, the output signals OUT of the scan driving device, which are outputted in a high state during the simultaneous output period P1, are outputted at a low level based on the first low potential power source voltage VGL1 during the period between seventh and eighth time points t7 and t8.

During the period between seventh and eighth time points t7 and t8, the first low potential power source voltage VGL1 is transferred to the third node Q3 through the fifteenth transistor M15 turned-on by the clock bar signal CKB.

During the period between seventh and eighth time points t7 and t8, the twenty-third transistor M23 is turned on by the clock signal CK. The second low potential power source voltage VGL2 is transferred to the fourth node Q4 by the turned-on twenty-third transistor M23, and the pulse voltage of the gate clock signal GCK is blocked from being generated as the output signal by the twentieth transistor M20 turned off they the second low potential power source voltage VGL2 transferred to the fourth node Q4.

During the period between the seventh and eighth points t7 and t8, where the clock signal CK and the clock bar signal CKB are simultaneously transferred at the high level, the scan signals simultaneously generated at the high level pulse voltage during the simultaneous output period P1 are changed to have a low level and maintained at a low level pulse voltage.

Then, the sequential driving section POS is initiated when the start signal STV of forward direction driving is transferred at the high level at a ninth time point t9.

The start signal STV of forward direction driving corresponds to the input signal of the forward direction driving signal terminal IN of the shift register of the n-th stage where n is 1, that is, the shift register of the first stage. In the shift register of the other stages next to the first stage, the input signal of the forward direction driving signal terminal IN of each of the other stages corresponds to the output signal at the high level generated in and outputted from the shift register of the prior stage.

The third transistor M3 is turned on by the input signal of the forward direction driving signal terminal IN as the start signal STV of forward direction driving transferred at the high level at the ninth point t9 or the output signal of the shift register of the prior stage. The high potential power source voltage VGH is transferred to the first node Q1 through the turned-on third transistor M3. Then, each of the seventh transistor M7 and the sixteenth transistor M16 is turned on by the voltage of the first node Q1 applied with a high potential, e.g., the high potential power source voltage VGH. The seventh transistor M7 is turned on by the voltage of the first node Q1, and thereby transfers the second low potential power source voltage VGL2 to the second node Q2, such that the fourteenth transistor M14 is turned off again.

When the sixteenth transistor M16 is turned on, the sixteenth transistor M16 transfers the clock signal CK transferred from the clock signal terminal connected to the first electrode of the transistor M16 to the third node Q3, thus generating the output signal OUT. In such an embodiment, the output signal OUT of the shift register of a stage is generated based on the signal transferred from the clock signal terminal transferred to the third node Q3 thereof.

In an exemplary embodiment, where the shift register of the n-th stage is the shift register of the first stage, when the clock signal CK is inputted to the clock signal terminal, the output signal, that is, a first scan signal S1, is outputted at the high level during the period of tenth and eleventh time points t10 and t11 based on the clock signal CK.

In such an embodiment, when the output signal of the shift register of the first stage, that is the first scan signal S1, is outputted in a high level and applied as the input signal of the forward direction driving signal terminal IN of the second stage, the clock bar signal CKB is inputted to the clock signal terminal of the shift register of the second stage. Accordingly, a second output signal, that is, a second scan signal S2, is outputted at the high level during the period between twelfth and thirteenth time points t12 and t13 based on the clock bar signal CKB.

In such an embodiment, as described above, each shift register sequentially outputs the scan signals S1 to Sl in a high level state in response to the clock signal CK and the clock bar signal CKB alternately inputted to the clock signal terminal from the first stage to the last stage. In such an embodiment, the output signals generated in the shift register of the stages constituting the scan driving device during the period between the tenth time point t10, at which the scan signal S1 is outputted from the shift register of the first stage, and a fifteenth time point t15, at which the scan signal is outputted from the shift register of the last stage, that is, the scan signals S1 to Sl, are sequentially outputted at the high level based on the clock signal CK or the clock bar signal CKB alternately inputted to the clock signal terminal. Accordingly, the period between the tenth time point t10 and the fifteenth time point t15 may be referred to as a sequential output period P2.

In an exemplary embodiment, as shown in FIGS. 3 to 5, the fifth to thirteenth transistors M5 to M13 of each shift register of the scan driving device determine the voltages of the first node Q1 and the second node Q2, and may maintain the voltages of the first node Q1 and the second node Q2 at the low potential driving power source voltage during a predetermined period. Therefore, the sixteenth transistor M16, which is turned-on to generate the output signal of the scan driving device during the sequential driving period POS, may be turned off during a residual period where the output signal is not generated. In such an embodiment, the voltages of the first node Q1 and the second node Q2 are maintained at a substantially low voltage during the period where the sequential output signal is not generated such that the sixteenth transistor M16 is not turned-on by direct current ("DC") bias stress stability thereof.

The timing diagram of FIG. 5 further shows, after the sequential output period P2 is finished, conversion of the start bar signal STVB as the backward direction driving start signal into a high level and a transfer thereof between sixteenth and seventeenth time points t16 and t17. The start bar signal STVB in FIG. 5 is the start signal initiating backward direction driving of the scan driving device in an exemplary embodiment, but not being limited thereto. In an alternative exemplary embodiment, the shift registers of the scan driving device may sequentially output the scan signals either in a forward direction or a backward direction through one process of forward and backward direction driving processes.

Figure 6:
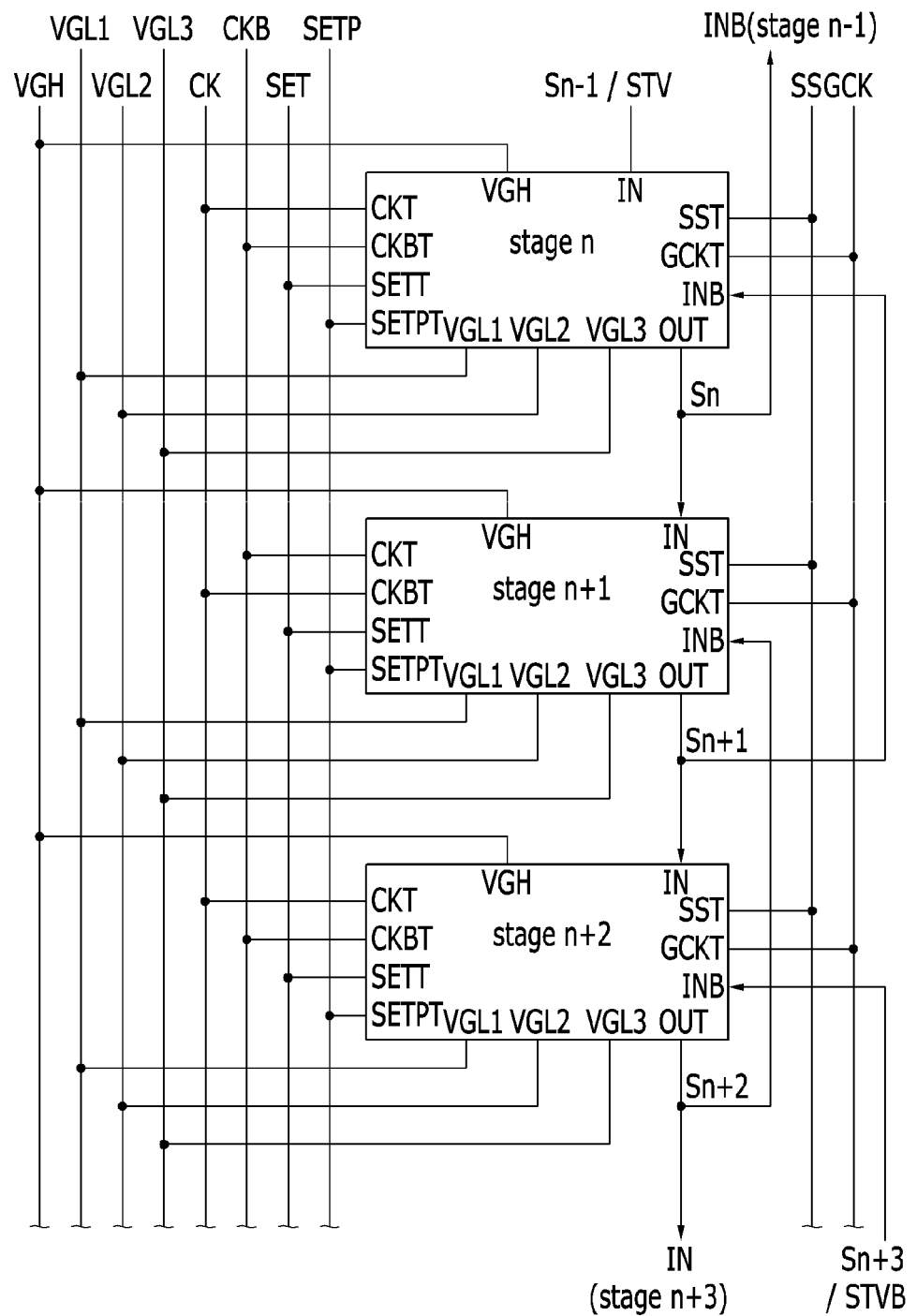
FIG. 6 is a block diagram showing stages of an alternative exemplary embodiment of the scan driving device of FIG. 1.
Figure 7:
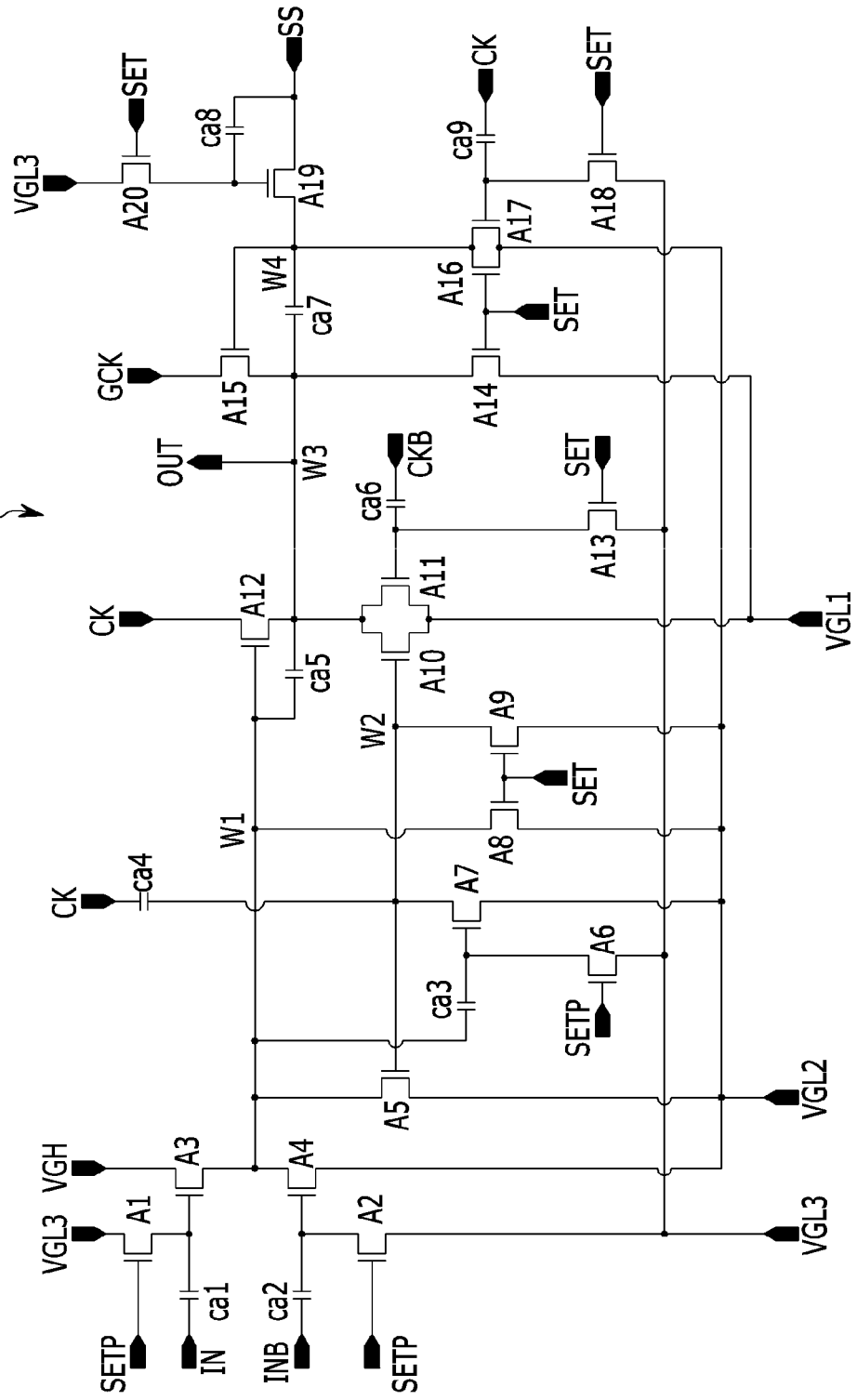
FIGS. 7 and 8 are circuit diagrams showing an exemplary embodiment of a stage of the scan driving device of FIG. 6.
Figure 8:
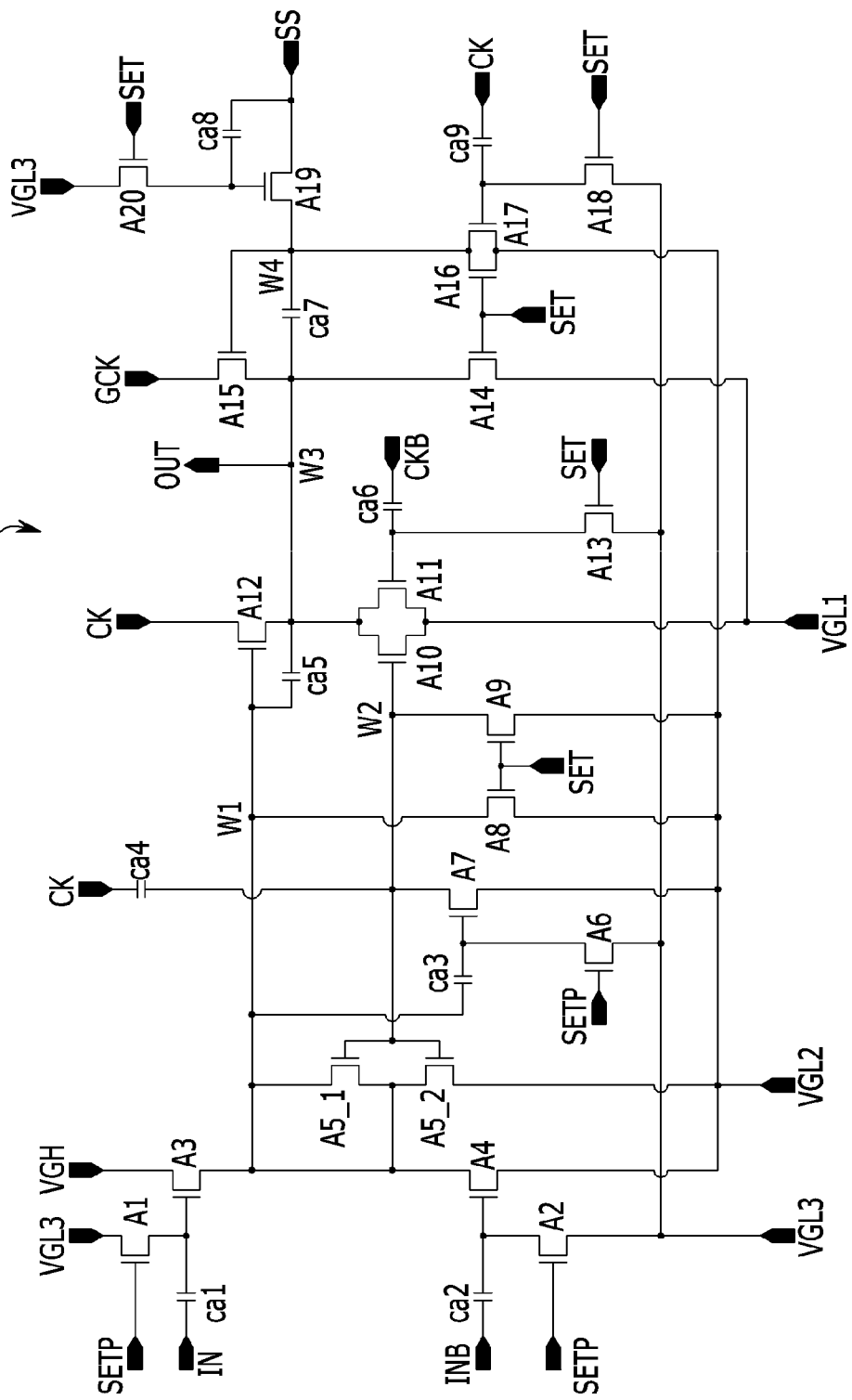

FIG. 6 is a block diagram showing an alternative exemplary embodiment of stages of the scan driving device of FIG. 1. FIGS. 7 and 8 are circuit diagrams showing an exemplary embodiment of a stage of the scan driving device of FIG. 6.

The stages shown in FIG. 6 is substantially the same as the stages shown in FIG. 2 except for a sustain control signal terminal SETPT. The same or like elements shown in FIG. 6 have been labeled with the same reference characters as used above to describe the exemplary embodiments of the stages shown in FIG. 2, and any repetitive detailed description thereof will hereinafter be omitted or simplified.

In FIG. 6, three stages, e.g., the n-th to (n+2)-th stages (stage n, stage n+1, stage n+2) of the stages of the scan driving device are shown. In an exemplary embodiment, each shift register includes eight input terminals and one output terminal, and the connection terminals of the driving power source voltages.

In such an embodiment, each shift register further includes the sustain control signal terminal SETPT, and a sustain control signal is applied to the sustain control signal terminal SETPT of each shift register.

In an exemplary embodiment, as shown in FIG. 6, the sustain signal SET inputted to the sustain signal terminal SETT of the shift register of each stage and the sustain control signal SETP inputted to the sustain control signal terminal SETPT may be each inputted before the driving of the scan driver is initiated. In such an embodiment, the sustain signal functions to maintain different node voltages in the shift register circuit.

In such an embodiment, as shown in FIG. 7 or 8, the sustain signal SET functions to turn on at least one transistor of the shift register to maintain a predetermined node voltage at any one driving power source voltage of the driving power source voltages.

In such an embodiment, as shown in FIG. 7 or 8, the sustain control signal SETPT may transfer a predetermined driving power source voltage to the gate electrode voltage of the transistors that controls forward direction driving among the transistors of the shift register during a predetermined period.

The driving process of the stages shown in FIG. 6 will be described in greater detail with reference to the circuit diagrams shown in FIGS. 7 and 8.

The circuit diagrams of FIGS. 7 and 8, shows an exemplary embodiment of a stage designed with reduced number of transistors and reduced number of capacitors from the exemplary embodiment of the stage shown in FIGS. 3 and 4.

The circuit structure of the shift register of FIG. 8 is substantially the same as The circuit structure of the shift register of FIG. 7 except for a fifth transistor A5. The same or like elements shown in FIG. 8 have been labeled with the same reference characters as used above to describe the exemplary embodiment of the n-th stage shown in FIG. 7, and any repetitive detailed description thereof will be omitted.

Referring to FIG. 7, an exemplary embodiment of the shift register of the n-th stage of the scan driving device includes 20 transistors, e.g., first to twentieth transistors A1 to A20, and 9 capacitors, e.g., first to ninth capacitors ca1 to ca9. In an exemplary embodiment, as shown in FIG. 7, the transistors of the shift registers of the scan driving device may be the NMOS transistor, but not being limited thereto.

In an exemplary embodiment, as shown in FIG. 7, the first transistor A1 of the shift register of the n-th stage (stage n) includes the gate electrode that receives the sustain control signal SETP through the sustain control signal terminal, the first electrode that receives the third low potential power source voltage VGL3, and the second electrode connected to the gate electrode of the third transistor A3. The first transistor A1 transfers the third low potential power source voltage VGL3 when the first transistor A1 is turned on in response to the sustain control signal SETP.

The second transistor A2 includes the gate electrode that receives the sustain control signal SETP through the sustain control signal terminal, the first electrode that receives the third low potential power source voltage VGL3, and the second electrode connected to the gate electrode of the fourth transistor A4. The second transistor A2 transfers the third low potential power source voltage VGL3 when the second transistor A2 is turned on in response to the sustain control signal SETP.

The third transistor A3 includes the gate electrode that receives the output signal Sn−1 of the shift register of the n−1-th stage (stage n−1), which is the prior stage, through the forward direction driving signal terminal as the input signal of the forward direction driving signal terminal IN, the first electrode that receives the high potential power source voltage VGH, and the second electrode connected to a first node W1. The third transistor A3 transfers the high potential power source voltage VGH to the first node W1 when the third transistor A3 is turned on in response to the input signal of the forward direction driving signal terminal IN. When the n-th stage is the first stage, the input signal of the forward direction driving signal terminal IN inputted to the gate electrode of the third transistor A3 is the start signal STV of forward direction driving.

Both electrodes of the first capacitor ca1 are connected to and between the forward direction driving signal terminal and the third transistor A3 to maintain the gate electrode voltage of the third transistor A3 during a predetermined period.

The fourth transistor A4 includes the gate electrode that receives the output signal Sn+1 of the shift register of the n+1-th stage (stage n+1), which is the next stage, the first electrode that receives the second low potential power source voltage VGL2, and the second electrode connected to the first node W1. The fourth transistor A4 transfers the second low potential power source voltage VGL2 to the first node W1 when the fourth transistor A4 is turned on. When the n-th stage is the last stage, the input signal of the backward direction driving signal terminal INB inputted to the gate electrode of the fourth transistor A4 is the start signal of backward direction driving, that is, the start bar signal STVB.

Both electrodes of the second capacitor ca2 are connected to and between the backward direction driving signal terminal and the fourth transistor A4 to maintain the gate electrode voltage of the fourth transistor A4 during a predetermined period.

The fifth transistor A5 includes the gate electrode connected to a second node W2, the first electrode that receives the second low potential power source voltage VGL2, and the second electrode connected to the first node W1. The fifth transistor A5 transfers the second low potential power source voltage VGL2 to the first node W1 when the fifth transistor A5 is turned on in response to the voltage applied to the second node W2.

In an alternative exemplary embodiment, as shown in FIG. 8, the fifth transistor A5 may be defined by at least two sub-transistors, e.g., a first sub-transistor A5_1 and a second sub-transistor A5-2, connected in series. In such an embodiment, the first and second sub-transistors A5_1 and A5_2 are connected to each other, thereby defining a dual gate, such that when the voltage of the first node W1 is a high level voltage, the high level voltage of the first node W1 may be efficiently maintained by effectively preventing a leakage current flowing therefrom.

The sixth transistor A6 includes the gate electrode that receives the sustain control signal SETP through the sustain control signal terminal, the first electrode that receives the third low potential power source voltage VGL3, and the second electrode connected to the gate electrode of the seventh transistor A7. The sixth transistor A6 transfers the third low potential power source voltage VGL3 to the gate electrode of the seventh transistor A7 when the sixth transistor A6 is turned on in response to the sustain control signal SS.

The seventh transistor A7 includes the gate electrode connected to the first node W1 to receive the voltage applied to the first node W1, the first electrode that receives the second low potential power source voltage VGL2, and the second electrode connected to the second node W2. The seventh transistor A7 transfers the second low potential power source voltage VGL2 to the second node W2 when the seventh transistor A7 is turned on in response to the voltage applied to the first node W1.

Both electrodes of the third capacitor ca3 are connected to and between the first node W1 and the seventh transistor A7 to maintain the gate electrode voltage of the seventh transistor A7 during a predetermined period.

The eighth transistor A8 includes the gate electrode that receives the sustain signal SET through the sustain signal terminal, the first electrode that receives the second low potential power source voltage VGL2, and the second electrode connected to the first node W1. The eighth transistor A8 transfers the second low potential power source voltage VGL2 to the first node W1 when the eighth transistor A8 is turned on in response to the sustain signal SET.

The ninth transistor A9 includes the gate electrode that receives the sustain signal SET through the sustain signal terminal, the first electrode that receives the second low potential power source voltage VGL2, and the second electrode connected to the second node W2. The ninth transistor A9 transfers the second low potential power source voltage VGL2 to the second node W2 when the ninth transistor A9 is turned on in response to the sustain signal SET.

In such an embodiment, both electrodes of the fourth capacitor ca4 are connected to and between the clock signal terminal and the second node W2 to maintain a voltage level corresponding to a difference between the pulse voltage of the clock signal CK or the clock bar signal CKB inputted from the clock signal terminal and the voltage applied to the second node W2 during a predetermined period.

The tenth transistor A10 includes the gate electrode connected to the second node W2, the first electrode that receives the first low potential power source voltage VGL1, and the second electrode connected to a third node W3. The tenth transistor A10 transfers the first low potential power source voltage VGL1 to the third node W3 when the tenth transistor A10 is turned on in response to the voltage applied to the second node W2.

The eleventh transistor A11 includes the gate electrode connected to the clock bar signal terminal to receive the clock bar signal CKB, the first electrode that receives the first low potential power source voltage VGL1, and the second electrode connected to the third node W3. The eleventh transistor A11 transfers the first low potential power source voltage VGL1 to the third node W3 when the eleventh transistor A11 is turned on in response to the clock bar signal CKB.

In such an embodiment, the output signal terminal is connected to the third node W3, such that the output signal OUT is generated by setting the voltage transferred to the third node W3 in a pulse waveform of the output signal.

In such an embodiment, the twelfth transistor A12 includes the gate electrode connected to the first node W1, the first electrode that receives the clock signal CK through the clock signal terminal, and the second electrode connected to the third node W3. The twelfth transistor A12 transfers the voltage of the clock signal CK to the third node W3 when the twelfth transistor A12 is turned on in response to the voltage applied to the first node W1. Accordingly, the output signal OUT transferred through the third node W3 is generated by setting the voltage of the clock signal CK transferred when the twelfth transistor A12 is turned on in a pulse waveform of the output signal.

Both electrodes of the fifth capacitor ca5 are connected to and between the gate electrode of the twelfth transistor A12 and the second electrode, and a difference between voltages applied to the both electrodes of the fifth capacitor ca5 is maintained. Accordingly, the fifth capacitor ca5 generates the output signal OUT based on the clock signal CK by maintaining a switching turn-on operation of the twelfth transistor A12 during a predetermined period where the twelfth transistor A12 is turned on.

The thirteenth transistor A13 includes the gate electrode that receives the sustain signal SET applied through the sustain signal terminal, the first electrode connected to the second low potential power source voltage VGL2, and the second electrode connected to the gate electrode of the eleventh transistor A11. The thirteenth transistor A13 transfers the second low potential power source voltage VGL2 to the gate electrode of the eleventh transistor A11 when the thirteenth transistor A13 is turned on in response to the sustain signal SET.

Both electrodes of the sixth capacitor ca6 are connected to the clock bar signal terminal and the gate electrode of the eleventh transistor A11, such that the voltage applied to the gate electrode of the eleventh transistor A11 is maintained.

The fourteenth transistor A14 includes the gate electrode that receives the sustain signal SET applied through the sustain signal terminal, the first electrode connected to the first low potential power source voltage VGL1, and the second electrode connected to the third node W3. The fourteenth transistor A14 transfers the first low potential power source voltage VGL1 to the third node W3 when the fourteenth transistor A14 is turned on in response to the voltage applied to the sustain signal SET.

The fifteenth transistor A15 includes the gate electrode connected to a fourth node W4, the first electrode that receives the gate clock signal GCK through the gate clock signal terminal, and the second electrode connected to the third node W3. The fifteenth transistor A15 transfers the pulse voltage of the gate clock signal GCK to the third node W3 when the fifteenth transistor A15 is turned on in response to the voltage applied to the fourth node W4. The output signal terminal is connected to the third node W3. Accordingly, the pulse voltage waveform of the output signal OUT is generated based on the pulse voltage of the gate clock signal GCK when the fifteenth transistor A15 is turned on.

In such an embodiment, both electrodes of the seventh capacitor ca7 are connected to and between the third node W3 (e.g., the second electrode of the fifteenth transistor A15) and the fourth node W4, and a difference between voltages of the both electrodes of the seventh capacitor ca7 is maintained during a predetermined period, such that the difference between the voltages of the gate electrode and the second electrode of the fifteenth transistor A15 may be maintained during a predetermined period.

The sixteenth transistor A16 includes the gate electrode that receives the sustain signal SET applied through the sustain signal terminal, the first electrode connected to the second low potential power source voltage VGL2, and the second electrode connected to the fourth node W4. The sixteenth transistor A16 transfers the second low potential power source voltage VGL2 to the fourth node W4 when the sixteenth transistor A16 is turned on in response to the voltage applied to the sustain signal SET.

The seventeenth transistor A17 includes the gate electrode that receives the clock signal CK applied through the clock signal terminal, the first electrode connected to the second low potential power source voltage VGL2, and the second electrode connected to the fourth node W4. The seventeenth transistor A17 transfers the second low potential power source voltage VGL2 to the fourth node W4 when the seventeenth transistor A17 is turned on in response to the clock signal CK.

In such an embodiment, both electrodes of the ninth capacitor ca9 are connected to the clock signal terminal and the gate electrode of the seventeenth transistor A17. Accordingly, the gate electrode voltage of the seventeenth transistor A17 may be maintained during a predetermined period.

In such an embodiment, the eighteenth transistor A18 includes the gate electrode that receives the sustain signal SET applied through the sustain signal terminal, the first electrode connected to the third low potential power source voltage VGL3, and the second electrode connected to the gate electrode of the seventeenth transistor A17. The eighteenth transistor A18 transfers the third low potential power source voltage VGL3 to the gate electrode of the seventeenth transistor A17 when the eighteenth transistor A18 is turned on in response to the sustain signal SET.

The nineteenth transistor A19 includes the gate electrode connected to one electrode of the twentieth transistor A20, the first electrode that receives the control signal SS applied through the control signal terminal, and the second electrode connected to the fourth node W4. The nineteenth transistor A19 transfers the voltage of the control signal SS to the fourth node W4 when the nineteenth transistor A19 is turned on in response to the voltage transferred through the twentieth transistor A20.

Both electrodes of the eighth capacitor ca8 are connected to the gate electrode of the nineteenth transistor A19 and the first electrode, and a difference between voltages of the both electrodes of the eighth capacitor ca8 is stored and maintained. Therefore, the eighth capacitor ca8 may maintain the gate electrode voltage of the nineteenth transistor A19 during a predetermined period.

In such an embodiment, the twentieth transistor A20 includes the gate electrode that receives the sustain signal SET applied through the sustain signal terminal, the first electrode connected to the third low potential power source voltage VGL3, and the second electrode connected to the gate electrode of the nineteenth transistor A19. The twentieth transistor A20 transfers the third low potential power source voltage VGL3 to the gate electrode of the nineteenth transistor A19 when the twentieth transistor A20 is turned on in response to the sustain signal SET.

The operation of the scan driving device of FIGS. 7 and 8 will hereinafter be described in detail with reference to FIG. 9.

Figure 9:
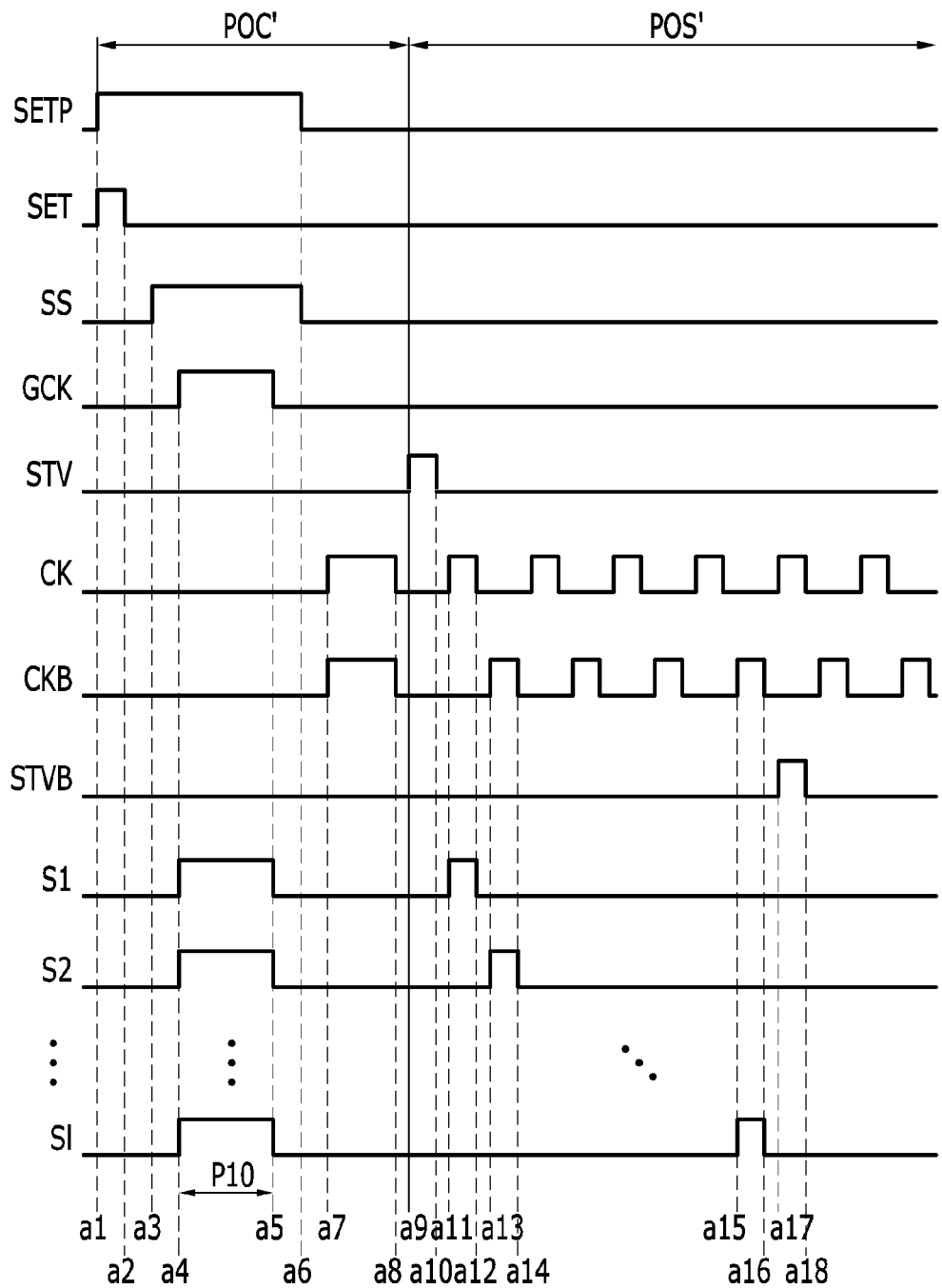
FIG. 9 is a signal timing diagram showing signals for an operation of the scan driving device of FIGS. 7 and 8.

FIG. 9 is a signal timing diagram showing signals for an operation of the scan driving device of FIGS. 7 and 8.

As described above, the shift register of the n-th stage of the scan driving device of FIG. 8 is substantially the same as the shift register of the n-th stage of the scan driving device of FIG. 7, except for the fifth transistor. Accordingly, an operation of the stage will be described with reference to the signal timing diagram of FIG. 9 along with the circuit structure of FIG. 7.

In an exemplary embodiment, the transistors of the scan driving device may be NMOS transistors. In such an embodiment, as shown in FIG. 9, the gate-on voltage level is a high level.

A driving section (e.g., a unit driving time period for driving the scan lines S1-Sn) of the operation of the scan driving device, as shown in the timing diagram of FIG. 9, is divided into a simultaneous driving section POC', in which the output signals (e.g., the scan signal) are simultaneously generated, and a sequential driving section POS', in which the output signals (e.g., the scan signals) are sequentially generated to the scan lines S1-Sn in the scan driving device corresponding to the pixel rows.

In such an embodiment, as shown in FIG. 9, the sustain control signal SETP is increased to a high level and transferred during the period between first to seventh time points a1 to a7.

A shown in the timing diagram of FIG. 9, in such an embodiment, the sustain signal SET is increased to a high level and transferred during the period between the first time point a1 and a second time point a2 before a driving of the scan driving device is initiated.

Referring to FIGS. 7 and 9, each of the first, second and sixth transistors A1, A2 and A6 is turned on by the sustain control signal SETP transferred at the high level during the period between the first to seventh time points a1 to a7.

During the period between the first to seventh time points a1 to a7, the gate electrode voltage of the third transistor A3 is maintained at the third low potential power source voltage VGL3 by the turned-on first transistor A1. The gate electrode voltage of the fourth transistor A4 is maintained at the third low potential power source voltage VGL3 by the turned-on second transistor A2. Accordingly, the third and fourth transistors A3 and A4 are stably turned-off during the period between the first to seventh time points a1 to a7.

In such an embodiment, the gate electrode voltage of the seventh transistor A7 is maintained at the third low potential power source voltage VGL3 by the turned-on sixth transistor A6, such that the seventh transistor A7 is turned off during the period between the first to seventh time points a1 to a7.

Each of the eighth, ninth, thirteenth and twentieth transistors A8, A9, A13, A18 and A20 is turned on by the sustain signal SET transferred at the high level during the period between the first and second time points a1 and a2 in the period between the first to seventh time points a1 to a7.

The voltage of the first node W1 is maintained at the second low potential power source voltage VGL2 by the turned-on eighth transistor A8. The voltage of the second node W2 is maintained at the second low potential power source voltage VGL2 by the turned-on ninth transistor A9. Accordingly, both the twelfth transistor A12 connected to the first node W1 and the tenth transistor A10 connected to the second node W2 are turned-off during the period between the first and second time points a1 and a2.

During the period between the first and second time points a1 and a2, the gate electrode voltage of the eleventh transistor A11 is maintained at the second low potential power source voltage VGL2 by the turned-on thirteenth transistor A13, and the gate electrode voltage of the seventeenth transistor A17 is maintained at the third low potential power source voltage VGL3 by the turned-on eighteenth transistor A18. Accordingly, each of the eleventh transistor A11 and the seventeenth transistor A17 is turned off during the period between the first and second time points a1 and a2.

During the period between the first and second time points a1 and a2, the gate electrode voltage of the nineteenth transistor A19 is maintained at the third low potential power source voltage VGL3 by the turned-on twentieth transistor A20, thereby turning-off the nineteenth transistor A19.

After the period between the first and second time points a1 and a2, the control signal SS is converted into a high level at a third time point a3 and maintained at the high level until a sixth time point a6. Then, the nineteenth transistor A19 that receives the control signal SS is turned on during the period between the third and sixth time points a3 to a6.

Then, the pulse voltage of the control signal SS is transferred to the fourth node W4 through the turned-on nineteenth transistor A19. Then, the pulse voltage of the control signal SS transferred to the fourth node W4 is at the high level, thus turning-on the fifteenth transistor A15, to which the voltage of the fourth node W4 is transferred. In such an embodiment, the pulse voltage of the gate clock signal GCK converted into the high level at the fourth time point a4 is transferred to the third node W3 through the turned-on fifteenth transistor A15. The pulse voltage of the gate clock signal GCK is generated as the pulse voltage of the output signal OUT and outputted during the period between the fourth and fifth time points a4 and a5.

Accordingly, a plurality of output signals generated in the shift registers of a plurality of stages constituting the scan driving device during the simultaneous output period P10 between the fourth and fifth points a4 and a5, that is, a plurality of scan signals S1 to Sn, may be all simultaneously outputted at the high level based on the gate clock signal GCK.

Meanwhile, after the simultaneous output period P10 elapses, the clock signal CK and the clock bar signal CKB applied to each shift register of the scan driving device are transferred at the high level voltage during the period between seventh and eighth time points a7 and a8.

The second node W2, to which the clock signal CK is applied during the period between the seventh and eighth time points a7 and a8, has a high voltage level, and thereby turns on the fifth and tenth transistors A5 and A10.

Then, a turned-off state of the twelfth transistor A12 is maintained by the fifth transistor A5, and the first low potential power source voltage VGL1 is applied to the third node W3 by the turned-on tenth transistor A10.

In such an embodiment, the clock bar signals CKB are simultaneously transferred at the high level voltage during the period between the seventh and eighth time points a7 and a8. Accordingly, the eleventh transistor A11 is turned on during the period between the seventh and eighth time points a7 and a8. Therefore, the first low potential power source voltage VGL1 is applied to the third node W3 by the turned-on eleventh transistor A11.

Accordingly, the output signals OUT of the scan driving device all simultaneously outputted in a high state during the simultaneous output period P10 are maintained at a low level based on the first low potential power source voltage VGL1.

In an exemplary embodiment, as shown in FIG. 9, when the simultaneous driving section POC' ends, the sequential driving section POS' is initiated at a ninth time point a9. In such an embodiment, the start signal STV of forward direction driving is transferred at the high level at the ninth time point a9 to initiate forward direction sequential driving of the scan driving device.

When the shift register of FIG. 7 is the shift register of the first stage, the start signal STV of forward direction driving is transferred as the input signal of the forward direction driving signal terminal IN. When the shift register is the shift register of a stage next to the first stage, the output signal (scan signal) of the prior stage is transferred as the input signal to the forward direction driving signal terminal IN.

Then, the third transistor A3 is turned on by the input signal of the forward direction driving signal terminal IN transferred at the high level at the ninth time point a9. The high potential power source voltage VGH is transferred to the first node W1 through the turned-on third transistor A3. Then, each of the seventh and twelfth transistor A7 and the transistor A12 is turned on by the voltage of the first node W1 in a high potential. The transistor A7 is turned on, and thereby transfers the second low potential power source voltage VGL2 to the second node W2, thus turning-off the tenth transistor A10 again.

In such an embodiment, the twelfth transistor A12 is turned on to transfer the clock signal CK transferred from the clock signal terminal connected to the first electrode of the twelfth transistor A12 to the third node W3, thus generating the output signal OUT. In such an embodiment, the output signal OUT of the shift register is generated based on the signal transferred from the clock signal terminal transferred to the third node W3. In such an embodiment, when the clock signal CK is transferred to the clock signal terminal, an output signal waveform is transferred in a high level by the clock signal CK. When the clock bar signal CKB is transferred to the clock signal terminal, the output signal waveform is transferred in a high state by the clock bar signal CKB.

In such an embodiment, as shown in FIG. 6, the clock signal CK and the clock bar signal CKB are alternately applied to the clock signal terminals of the shift registers. Accordingly, each stage may sequentially generate the output signals (scan signal) at the high level based on the clock signal CK or the clock bar signal CKB.

The output signals at the high level are sequentially generated from an eleventh time point a11 to a sixteenth point a16, and the start bar signal STVB as the backward direction driving start signal may be converted into the high level at a seventeenth point a17, and transferred to the shift register.

In FIG. 9, for convenience of illustration, an exemplary embodiment, where the backward direction driving start signal is shown immediately after the forward direction driving process, but the invention is not limited thereto.

When the start bar signal STVB is transferred at the high level, backward direction driving may be initiated to enable each shift register to generate the output signals at the high level, reversely.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A scan driving device comprising:
a plurality of shift registers which generates a plurality of scan signals and transfers the scan signals to a plurality of scan lines of a display device,
wherein the shift registers define a plurality of stages, respectively, and
a shift register of each stage comprises:
a first signal terminal to which a forward direction driving start signal or an output signal of the shift register of a prior stage is transferred;
a second signal terminal to which a backward direction driving start signal or the output signal of the shift register of a next stage is transferred;
a clock signal terminal to which one of a clock signal and a clock bar signal is applied, wherein the clock signal terminal of the shift register of one of two adjacent stages receives the clock signal, and the clock signal terminal of the shift register of the other of the two adjacent stages receives the clock bar signal;
a clock bar signal terminal to which the other of the clock bar signal and the clock signal is applied, wherein the clock bar signal terminal of the shift register of the one of the two adjacent stages receives the clock bar signal, and the clock bar signal terminal of the shift register of the other of the two adjacent stages receives the clock signal;
a sustain signal terminal to which a sustain signal is transferred;
a control signal terminal to which a control signal is transferred;
a gate clock signal terminal to which a gate clock signal is transferred; and
an output signal terminal connected to a corresponding scan line of the scan lines, the first signal terminal of the shift register of the next stage and the second signal terminal of the shift register of the prior stage, wherein the output signal terminal outputs a scan signal of the corresponding scan line as the output signal thereof,
wherein
a plurality of driving power source voltages comprising a high potential power source voltage and a plurality of low potential power source voltages is applied to the shift register of each stage, and
an application of the low potential power source voltages to the shift register of each stage is controlled based on the sustain signal applied to the sustain signal terminal thereof,
wherein
the low potential power source voltages comprises a first low potential power source voltage, a second low potential power source voltage, and a third low potential power source voltage, and
a voltage level of the second low potential power source voltage is lower than a voltage level of the first low potential power source voltage, and higher than a voltage level of the third low potential power source voltage.

2. The scan driving device of claim 1, wherein the shift register of each stage further comprises:
a sustain control signal terminal to which a sustain control signal, which controls a first switch or a second switch, is transferred, wherein the first switch controls a forward direction driving thereof, and the second switch controls a backward direction driving thereof, and
wherein the sustain signal applied to the sustain signal terminal controls a switch for controlling a transfer of the low potential power source voltages to a node therein.

3. The scan driving device of claim 1, wherein
the sustain signal is transferred at a first level voltage for turning-on a switch of the shift registers before a driving of the shift registers is initiated.

4. The scan driving device of claim 3, wherein
the driving of the shift registers comprises a simultaneous driving, in which a plurality of output signals of the shift registers are simultaneously outputted, and a sequential driving, in which the output signals of the shift registers are sequentially outputted in a forward direction or a backward direction.

5. The scan driving device of claim 1, wherein
the shift registers simultaneously generate a plurality of output signals during a first period where the control signal is transferred to the shift registers at a first level voltage for turning-on a switch of the shift registers.

6. The scan driving device of claim 5, wherein the output signals simultaneously generated in the shift registers during the first period are generated based on the gate clock signal transferred during the first period.

7. The scan driving device of claim 5, wherein after the first period elapses, the clock signal and the clock bar signal transferred to the shift register of each stage are transferred at the first level voltage to output the output signals of shift registers at one of the low potential power source voltages.

8. The scan driving device of claim 1, wherein an input signal applied to the first signal terminal of the shift register of each stage is transferred at a first level voltage for turning-on a switch of the shift registers, and
the shift registers sequentially generate a plurality of output signals in a forward direction.

9. The scan driving device of claim 8, wherein the output signals sequentially generated in the shift register of each stage are generated based on on the clock signal or the clock bar signal transferred to the clock signal terminal of the shift register of each stage.

10. The scan driving device of claim 1, wherein an input signal applied to the second signal terminal of the shift register of each stage is transferred at a first level voltage for turning-on a switch of the shift registers, and
the shift registers sequentially generate output signals in the backward direction.

11. The scan driving device of claim 1, wherein the shift register of each stage further comprises:
a first transistor which transfers one power source voltage of the low potential power source voltages in response to the sustain signal;
a second transistor comprising a gate electrode connected to the first transistor, wherein the second transistor transfers the high potential power source voltage to a first node in response to the forward direction driving start signal or the output signal of the shift register of the prior stage; and
a third transistor which generates the output signal based on a pulse voltage of the clock signal or the clock bar signal transferred to the clock signal terminal in response to a voltage of the first node.

12. The scan driving device of claim 11, wherein the shift register of each stage further comprises:
a fourth transistor which transfers one power source voltage of the low potential power source voltages in response to the sustain signal; and
a fifth transistor comprising the gate electrode connected to one electrode of the fourth transistor and which transfers one power source voltage of the low potential power source voltages to the first node in response to the backward direction driving start signal or the output signal of the shift register of the next stage.

13. The scan driving device of claim 12, wherein the shift register of each stage further comprises:
a sixth transistor which transfers one power source voltage of the low potential power source voltages in response to the sustain signal;
a seventh transistor comprising a gate electrode connected to the sixth transistor, wherein the seventh transistor transfers one power source voltage of the low potential power source voltages to a second node in response to the voltage of the first node;
an eighth transistor comprising a gate electrode connected to the second node, wherein the eight transistor transfers one power source voltage of the low potential power source voltages to the first node in response to a voltage of the second node; and
a first capacitor connected between the first node and the gate electrode of the seventh transistor.

14. The scan driving device of claim 13, wherein the second node is connected to the clock signal terminal through a second capacitor, and
the pulse voltage of the clock signal or the clock bar signal transferred to the clock signal terminal is transferred to the second node.

15. The scan driving device of claim 13, wherein the eighth transistor comprises at least two sub-transistors connected in series, and
gate electrodes of the at least two sub-transistors are commonly connected to the second node.

16. The scan driving device of claim 13, wherein the shift register of each stage further comprises:
a ninth transistor which transfers one power source voltage of the low potential power source voltages in response to the voltage of the second node to a third node to which the output signal terminal is connected; and
a tenth transistor which transfers one power source voltage of the low potential power source voltages to the third node in response to the clock signal or the clock bar signal inputted to the clock bar signal terminal.

17. The scan driving device of claim 16, wherein the shift register of each stage further comprises:
an eleventh transistor which transfers one power source voltage of the low potential power source voltages in response to the sustain signal;
a twelfth transistor comprising a gate electrode which receives the power source voltage transferred by the eleventh transistor, wherein the twelfth tarnsistor transfers the pulse voltage of the control signal to a fourth node in response to the power source voltage;
a thirteenth transistor comprising a gate electrode connected to the fourth node, wherein the thirteenth transistor transfers the pulse voltage of the gate clock signal to the third node in response to a voltage of the fourth node;
a second capacitor connected between the gate electrode of the twelfth transistor and the control signal terminal; and
a third capacitor connected between the third node and the fourth node.

18. The scan driving device of claim 17, wherein the shift register of each stage further comprises:
a fourteenth transistor which transfers one power source voltage of the low potential power source voltages to the third node in response to the sustain signal;
a fifteenth transistor which transfers one of the low potential power source voltages, which is different from the one power source voltage transferred by fourteenth transistor, to the fourth node in response to the sustain signal;
a sixteenth transistor which transfers one power source voltage of the low potential power source voltages to the fourth node in response to the clock signal or the clock bar signal transferred to the clock signal terminal; and a seventeenth transistor which transfers one power source voltage of the low potential power source voltages to the gate electrode of the sixteenth transistor in response to the sustain signal.

19. The scan driving device of claim 18, wherein the shift register of each stage further comprises:
an eighteenth transistor which transfers one power source voltage of the low potential power source voltages in response to the sustain signal;
a nineteenth transistor comprising a gate electrode connected to the eighteenth transistor, wherein the nineth transistor transfers one power source voltage of the low potential power source voltages to the first node in response to the control signal transferred to the gate electrode thereof; and
a twentieth transistor which transfers one power source voltage of the low potential power source voltages to the first node in response to the sustain signal.

20. The scan driving device of claim 18, wherein the shift register of each stage further comprises:
an eighteenth transistor which transfers one power source voltage of the low potential power source voltages to the first node in response to the sustain signal; and
a nineteenth transistor which transferrs one source voltage of the low potential power source voltages to the second node in response to the sustain signal.

21. The scan driving device of claim 18, wherein the shift register of each stage further comprises:
a twentieth transistor which transfers one power source voltage of the low potential power source voltages to a gate electrode of the tenth transistor in response to the sustain signal.

22. The scan driving device of claim 13, the shift register of each stage further comprises:
a twenty-first transistor which transfers one source voltage of the low potential power source voltages in response to the sustain signal;
a twenty-second transistor comprising a gate electrode connected to the twelfth transistor, wherein the twenty-second transistor transfers one power source voltage of the low potential power source voltages to the second node in response to the control signal transferred to the gate electrode thereof; and
a twenty-third transistor which transfers one power source voltage of the low potential power source voltages to the second node in response to the sustain signal.

23. The scan driving device of claim 22, wherein the shift register of each stage further comprises:
a twenty-fourth transistor which transfers one power source voltage of the low potential power source voltages to a gate electrode of the tenth transistor in response to the sustain signal;
a twenty-fifth transistor which transfers one power source voltage of the low potential power source voltages to the gate electrode of the tenth transistor in response to the control signal; and
a twenty-sixth transistor which transfers one power source voltage of the low potential power source voltages to the gate electrode of the twenth-fifth transistor in response to the sustain signal.

24. A display device comprising:
a display unit comprising:
a plurality of scan lines, through which a plurality of scan signals is transferred;
a plurality of data lines, through which a plurality of data signals is transferred; and
a plurality of pixels connected to the scan lines and the data lines;
a scan driver which generates the scan signals and which transfers a corresponding scan signal of the scan signals to each of the pixels;
a data driver which transfers the data signals to the data lines; and
a controller which control operations of the scan driver and the data driver,
wherein the scan driver comprises a plurality of shift registers which define a plurality of stages, wherein a shift register of each stage comprises:
a first signal terminal to which a forward direction driving start signal or an output signal of the shift register of a prior stage is transferred;
a second signal terminal to which a backward direction driving start signal or the output signal of the shift register of a next stage is transferred;
a clock signal terminal to which one of a clock signal and a clock bar signal is applied, wherein the clock signal terminal of the shift register of one of two adjacent stages receive the clock signal, and the clock signal terminal of the shift register of the other of the two adjacent stages receives the clock bar signal;
a clock bar signal terminal to which the other of the clock bar signal and the clock signal is applied, wherein the clock bar signal terminal of the shift register of the one of the two adjacent stages receive the clock bar signal, and the clock bar signal terminal of the shift register of the other of the two adjacent stages receives the clock signal;
a sustain signal terminal to which a sustain signal is transferred;
a control signal terminal to which a control signal is transferred;
a gate clock signal terminal to which a gate clock signal is transferred; and
an output signal terminal connected to a corresponding scan line of the scan lines, the first signal terminal of the shift register of the next stage and the second signal terminal of the shift register of the prior stage, wherein the output signal terminal outputs a scan signal of the corresponding scan line as the output signal thereof,
wherein a plurality of driving power source voltages comprising a high potential power source voltage and a plurality of low potential power source voltage is applied to the shift register of each stage, and
an application of the low potential power source voltages to the shift register of each stage is controlled based on the sustain signal applied to the sustan signal terminal thereof,
wherein
the low potential power source voltages comprises a first low potential power source voltage, a second low potential power source voltage, and a third low potential power source voltage, and
a voltage level of the second low potential power source voltage is lower than a voltage level of the first low potential power source voltage, and higher than a voltage level of the third low potential power source voltage.

25. The display device of claim 24, wherein the shift register of each stage further comprises:
a sustain control signal terminal to which a sustain control signal, which controls a first switch or a second switch, is transferred, wherein the first switch controls a forward direction driving thereof, and the second switch controls a backward direction driving thereof, and wherein the sustain signal applied to the sustain signal terminal controls a switch for controlling a transfer of the low potential power source voltages to a node therein.

26. The display device of claim 24, wherein when an input signal applied to the first signal terminal of each of the plurality of shift registers is transferred at a first level voltage for turning-on a switch of the shift registers, the scan driver sequentially generates the scan signals in a forward direction.

27. The display device of claim 24, wherein when an input signal applied to the second signal terminal of each of the shift registers is transferred at a first level voltage for turning-on a switch of the shift registers, the scan driver sequentially generates the scan signals in a backward direction.

28. The display device of claim 24, wherein the scan driver simultaneously generates the scan signals during a first period where the control signal is transferred at a first level voltage for turning-on a switch of the shift registers to each of the shift registers.

29. The display device of claim 28, wherein the scan signals simultaneously generated in the scan driver during the first period are generated based on the gate clock signal transferred during the first period.

\* \* \* \* \*